(12) United States Patent
Sato

(10) Patent No.: US 11,881,842 B2
(45) Date of Patent: Jan. 23, 2024

(54) COMPOSITE FILTER DEVICE AND BAND PASS FILTER

(71) Applicant: Murata Manufacturing Co., Ltd., Nagaokakyo (JP)

(72) Inventor: Tomoya Sato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 587 days.

(21) Appl. No.: 17/126,271

(22) Filed: Dec. 18, 2020

(65) Prior Publication Data

US 2021/0194460 A1   Jun. 24, 2021

(30) Foreign Application Priority Data

Dec. 23, 2019   (JP) ................. 2019-231795

(51) Int. Cl.
| | |
|---|---|
| *H03H 9/56* | (2006.01) |
| *H03H 9/42* | (2006.01) |
| *H03H 9/54* | (2006.01) |
| *H03H 9/13* | (2006.01) |
| *H03H 9/60* | (2006.01) |
| *H03H 9/70* | (2006.01) |
| *H03H 1/00* | (2006.01) |

(52) U.S. Cl.
CPC ............. *H03H 9/568* (2013.01); *H03H 9/13* (2013.01); *H03H 9/542* (2013.01); *H03H 9/547* (2013.01); *H03H 9/605* (2013.01); *H03H 9/706* (2013.01); *H03H 2001/0078* (2013.01)

(58) Field of Classification Search
CPC .......... H03H 2001/0085; H03H 9/568; H03H 9/145; H03H 9/1457; H03H 9/25

USPC ................................. 333/175, 185, 186
See application file for complete search history.

(56) References Cited

U.S. PATENT DOCUMENTS

| | | | |
|---|---|---|---|
| 9,647,634 B2 * | 5/2017 | Michigami | .......... H03H 9/0576 |
| 2015/0188512 A1 | 7/2015 | Michigami | |

(Continued)

FOREIGN PATENT DOCUMENTS

| | | |
|---|---|---|
| CN | 104662798 A | 5/2015 |
| JP | 2019009769 A | 1/2019 |

(Continued)

OTHER PUBLICATIONS

First Office Action in KR10-2020-0176409, dated Jan. 31, 2023, 3 pages.
Office Action in CN202011435524.5, dated Sep. 29, 2023, 8 pages.

*Primary Examiner* — Rakesh B Patel
(74) *Attorney, Agent, or Firm* — Keating & Bennett, LLP

(57) ABSTRACT

A composite filter device includes a connection portion connected to a common terminal, a first filter between the connection portion and a first terminal, a second filter between the connection portion and a second terminal, a first inductor that is connected in series between the second filter and the connection portion, includes a first wiring electrode wound in a predetermined direction, and is provided at an internal layer of a multilayer board, and a second inductor that is connected in series between the common terminal and the connection portion, includes a second wiring electrode wound in the predetermined direction, and is provided at an internal layer of the multilayer board. The first and second wiring electrodes at least partially overlap when the multilayer board is viewed in plan.

14 Claims, 24 Drawing Sheets

(56) References Cited

U.S. PATENT DOCUMENTS

2018/0375495 A1* 12/2018 Taguchi .............. H03H 9/0004
2019/0044492 A1     2/2019 Takata
2020/0067491 A1     2/2020 Ota et al.

FOREIGN PATENT DOCUMENTS

JP           6489294 B1    3/2019
KR    1020190015128 A      2/2019

* cited by examiner

COMPOSITE FILTER DEVICE AND BAND PASS FILTER

CROSS REFERENCE TO RELATED APPLICATIONS

This application claims the benefit of priority to Japanese Patent Application No. 2019-231795 filed on Dec. 23, 2019. The entire contents of this application are hereby incorporated herein by reference.

BACKGROUND OF THE INVENTION

1. Field of the Invention

The present invention relates to a composite filter device and a band pass filter.

2. Description of the Related Art

In radio communication devices or other devices, composite filter devices have recently been used and each are provided with various filters including a band pass filter for passing a signal in a predetermined frequency band. For example, Japanese Patent No. 6489294 discloses a technique for a multiplexer including three or more acoustic wave filters with which to reduce the insertion loss of each of the acoustic wave filters in the pass band by reducing a capacitance generated between the ground and a wiring line between the acoustic wave filter and an antenna terminal to which an antenna element is connected.

However, in the case of the technique disclosed in Japanese Patent No. 6489294, there is sometimes a need to increase the length of a wiring electrode forming an inductor as required to provide a predetermined inductance. Accordingly, the insertion loss in the pass band may be deteriorated because a stray capacitance is generated by the wiring electrode.

SUMMARY OF THE INVENTION

Preferred embodiments of the present invention provide a composite filter device and a band pass filter with which the insertion loss of a filter in the pass band is able to be reduced or prevented while providing a predetermined inductance.

A composite filter device according to a preferred embodiment of the present invention includes a connection portion connected to a common terminal, a first filter between the connection portion and a first terminal, a second filter between the connection portion and a second terminal, a first inductor that is connected in series between the second filter and the connection portion, includes a first wiring electrode wound in a predetermined direction, and is provided at an internal layer of a multilayer board, and a second inductor that is connected in series between the common terminal and the connection portion, includes a second wiring electrode wound in the predetermined direction, and is provided at an internal layer of the multilayer board. The first wiring electrode and the second wiring electrode at least partially overlap when the multilayer board is viewed in plan.

According to a preferred embodiment of the present invention, there can be provided a composite filter device and a band pass filter with which the insertion loss of a filter in the pass band is able to be reduced or prevented while providing a predetermined inductance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
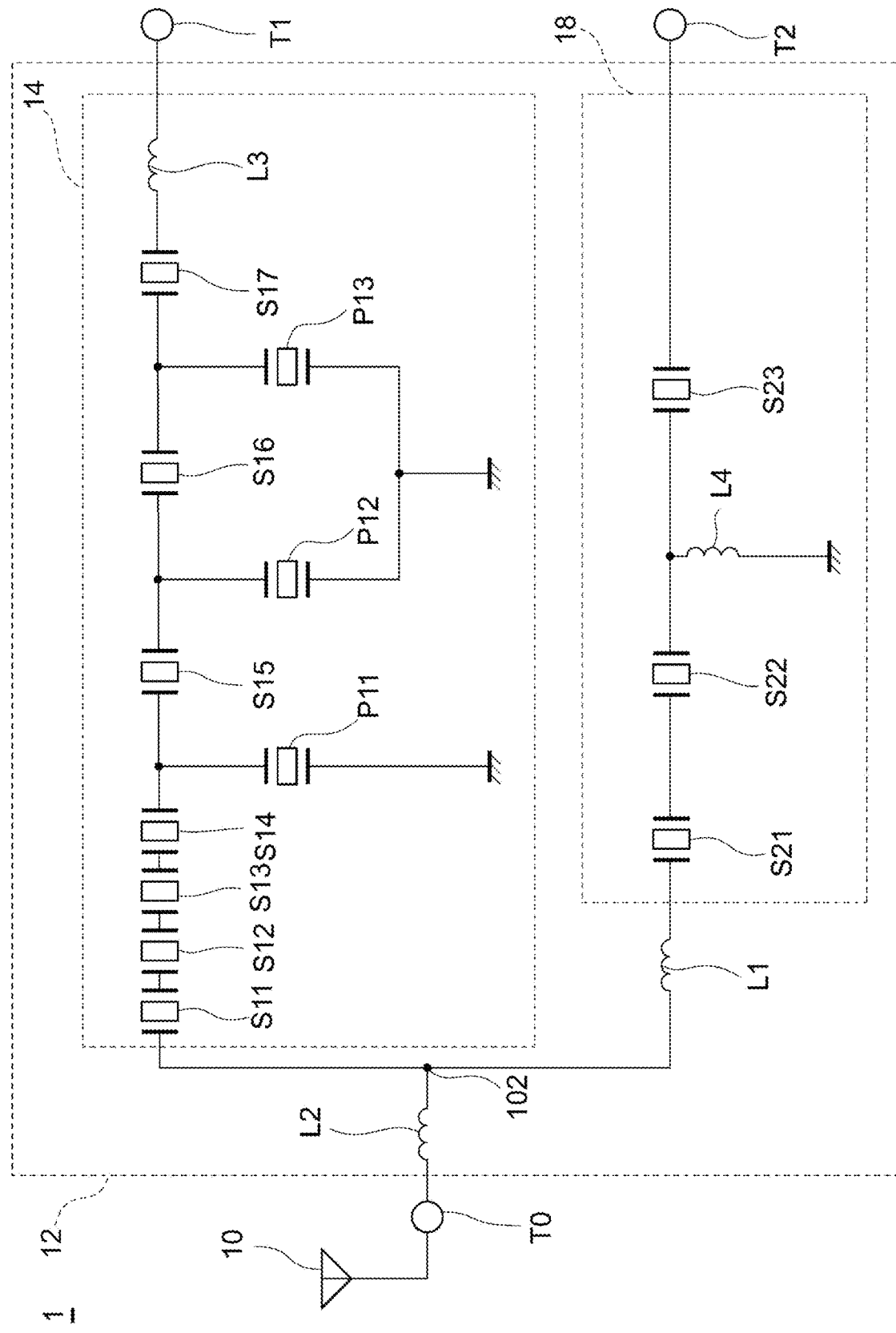
FIG. 1 is a diagram illustrating a communication device according to a first preferred embodiment of the present invention.

Preferred embodiments of the present invention will be described with reference to the accompanying drawings. In the drawings, the components represented by the same reference numeral have the same features, components, and elements or similar features, components, and elements.

FIG. 1 is a diagram illustrating a communication device according to a first preferred embodiment of the present invention. The communication device 1 according to this preferred embodiment may be installed into, for example, a mobile communication device, such as a cellular phone and performs the transmission and reception of a signal.

As illustrated in FIG. 1, the communication device 1 includes an antenna 10 and a composite filter device 12. The antenna 10 and the composite filter device 12 are connected to each other via a common terminal T0.

The antenna 10 performs the transmission and reception of a radio-frequency (RF) signal to/from a base station and the reception of a signal from a global positioning system (GPS).

The composite filter device 12 separates a transmission signal to be transmitted from the antenna 10 and a reception signal received by the antenna 10 in accordance with frequencies. The composite filter device 12 includes a band pass filter 14 (a first filter), a band elimination filter 18 (a second filter), an inductor L1 (a first inductor), and an inductor L2 (a second inductor). A node 102 (a connection portion) is connected to the common terminal T0 via the inductor L2. The band pass filter 14 is provided between the node 102 and a first terminal T1. The band elimination filter 18 is provided between the node 102 and a second terminal T2. The band elimination filter 18 is connected to the node 102 via the inductor L1. The band pass filter 14 is a filter that passes signals of a predetermined frequency and attenuates signals of frequencies other than the predetermined frequency. The band elimination filter 18 is a filter that attenuates signals of a predetermined signal and passes signals of frequencies other than the predetermined frequency. The band elimination filter 18 may be, for example, a notch filter having a relatively narrow stop band.

In this preferred embodiment, the pass band in which the band pass filter 14 passes signals overlaps the stop band in which the band elimination filter 18 attenuates signals. For example, when a GPS reception signal is to be extracted from various signals received by the antenna 10, the pass band of the band pass filter 14 and the stop band of the band elimination filter 18 are set to be the frequency of the GPS reception signal. Accordingly, the GPS reception signal passes through the band pass filter 14 and reception signals other than the GPS reception signal pass through the band elimination filter 18. Thus, the composite filter device 12 is able to extract a signal of a specific frequency from signals of various frequencies. The type of a signal to be extracted is not limited to GPS.

The composite filter device 12 according to this preferred embodiment will be described below. The band pass filter 14 outputs, from the first terminal T1, a reception signal supplied from the antenna 10 via the common terminal T0 and the node 102. The band elimination filter 18 outputs, from the second terminal T2, a reception signal supplied from the antenna 10 via the common terminal T0 and the node 102. The band pass filter 14 passes a reception signal in this preferred embodiment, but may pass a transmission signal instead of, or in addition to, a reception signal.

The band pass filter 14 is a ladder filter in which a plurality of resonators are provided at series and parallel arms. Specifically, the band pass filter 14 includes seven series arm resonators S11 to S17, three parallel arm resonators P11 to P13, and an inductor L3. The numbers of series arm resonators, parallel arm resonators, and inductors are merely examples and are not limited to the above-described numbers.

Components defining the series arm resonators S11 to S17 and the parallel arm resonators P11 to P13 are not particularly limited, and may be, for example, surface acoustic wave (SAW) filters, filters such as piezoelectric thin film resonators, or bulk acoustic wave (BAW) filters. The resonators S21 to S23, the series arm resonators S31 to S34, and the parallel arm resonators P31 to P33, which are described below, may include similar filters.

The seven series arm resonators S11 to S17 are connected in series with each other in order of increasing distance from the node 102 at the series arm connecting the node 102 and the first terminal T1. The three parallel arm resonators P11 to P13 are connected in parallel with each other in order of increasing distance from the node 102, and the three parallel arm resonators P11 to P13 branch off from the series arm. First ends of the three parallel arm resonators P11 to P13 are connected to the node between the series arm resonators S14 and S15, the node between the series arm resonators S15 and S16, and the node between the series arm resonators S16 and S17, respectively. A reference potential (for example, a ground potential) is supplied to second ends of the three parallel arm resonators P11 to P13.

Between the series arm resonator S17 and the first terminal T1, the inductor L3 is connected in series with the series arm resonator S17.

The band elimination filter 18 includes a plurality of resonators that are connected in series with each other. Specifically, the band elimination filter 18 includes the three resonators S21 to S23 and an inductor L4. The numbers of the resonators and inductors are merely examples and are not limited to the above-described numbers.

The resonators S21 to S23 are adjacently connected in series with each other in order of increasing distance from the node 102 on the line connecting the node 102 and the second terminal T2. A first end of the inductor L4 is connected to the node between the resonators S22 and S23. A reference potential (for example, a ground potential) is supplied to a second end of the inductor L4.

Between the node 102 and the resonator S21, the inductor L1 (the first inductor) is connected in series with the node 102. Between the common terminal T0 and the node 102, the inductor L2 (the second inductor) is connected in series with the node 102.

In this preferred embodiment, the pass band and pass band width of the band pass filter 14 and the stop band and stop band width of the band elimination filter 18 are substantially the same.

Figure 2:
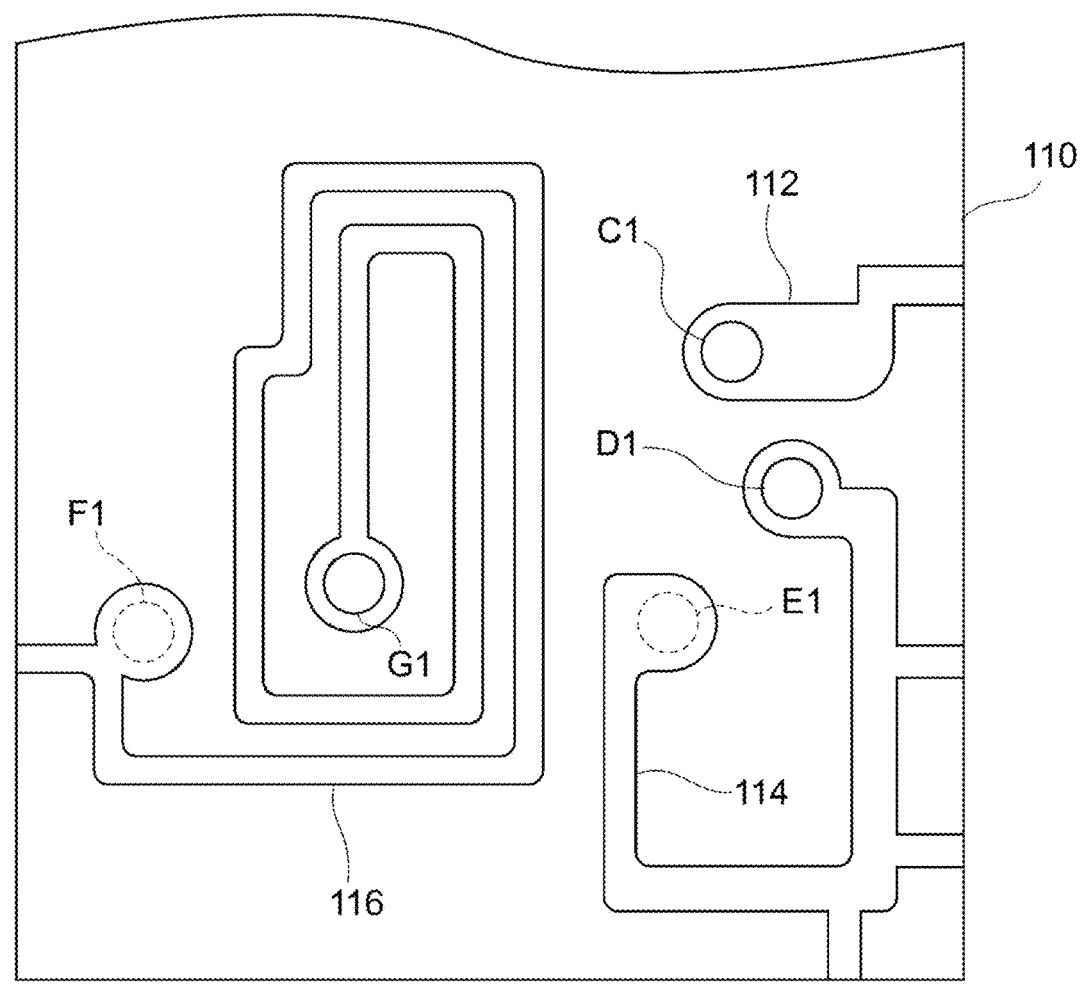
FIG. 2 is a diagram illustrating the positional relationship between wiring electrodes in a composite filter device according to the first preferred embodiment of the present invention when a first layer in a multilayer board is viewed in plan.
Figure 3:
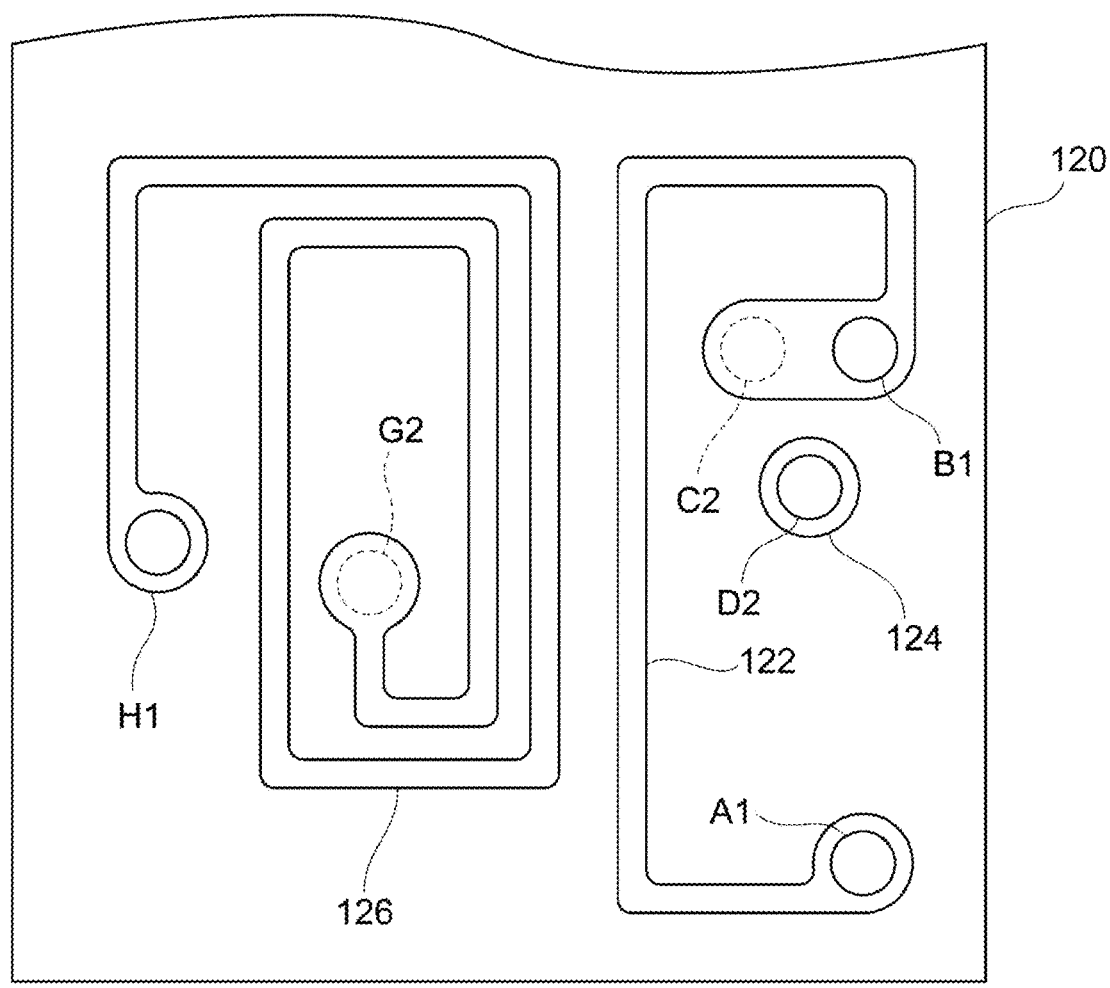
FIG. 3 is a diagram illustrating the positional relationship between wiring electrodes in the composite filter device according to the first preferred embodiment of the present invention when a second layer in the multilayer board is viewed in plan.
Figure 4:
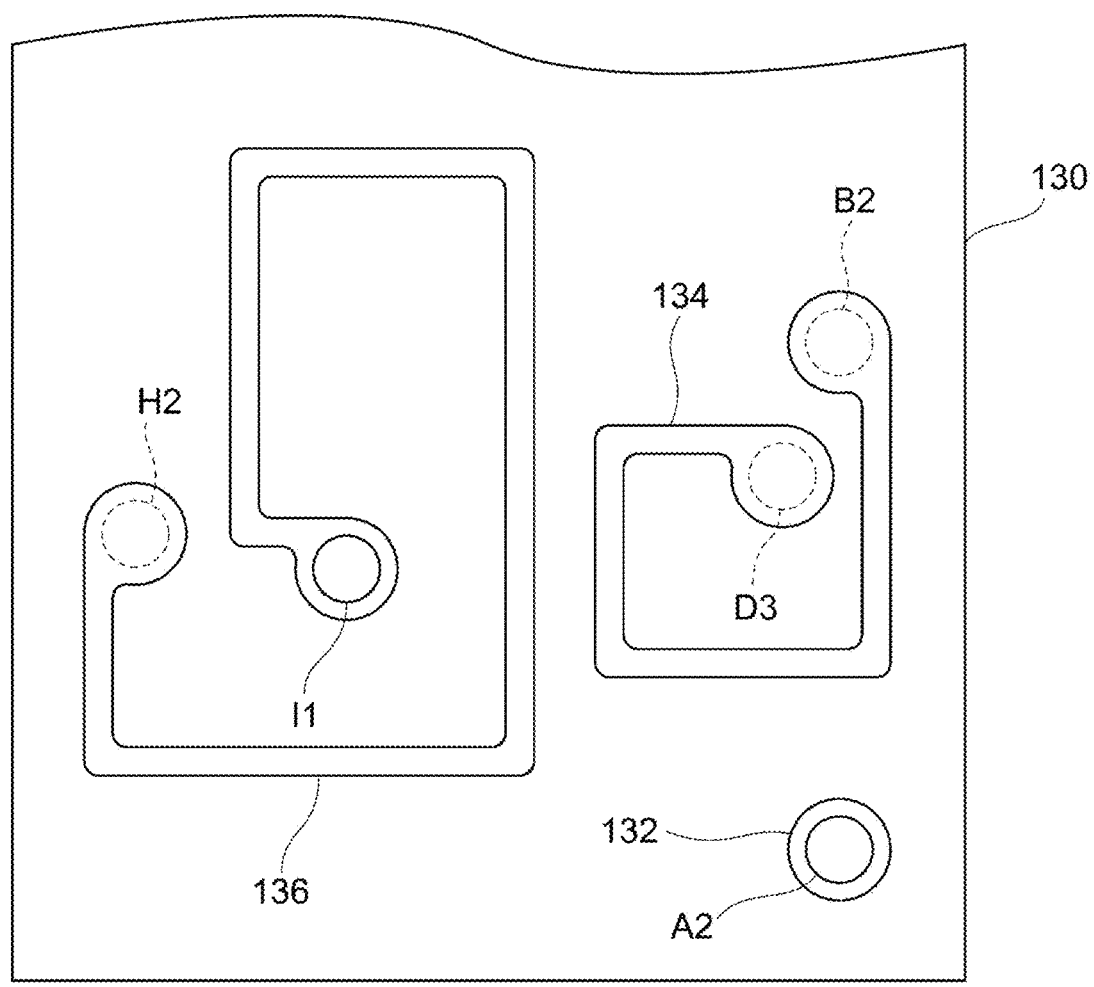
FIG. 4 is a diagram illustrating the positional relationship between wiring electrodes in the composite filter device according to the first preferred embodiment of the present invention when a third layer in the multilayer board is viewed in plan.

In the composite filter device 12 according to this preferred embodiment, the wiring electrodes connecting the various resonators and the wiring electrodes defining the inductors are provided at the internal layers of a multilayer board having a layered structure. The layout of the wiring electrodes defining the inductors L1 to L3 according to this preferred embodiment will be described with reference to FIGS. 2 to 4. FIGS. 2 to 4 are diagrams illustrating the positional relationship between the wiring electrodes in the composite filter device 12 according to this preferred embodiment when a multilayer board is viewed in plan.

When a direction extending from the back to the front of the drawing sheet is defined as a direction from bottom to top, a first layer 110 illustrated in FIG. 2, a second layer 120 illustrated in FIG. 3, and a third layer 130 illustrated in FIG. 4 are laminated in this order from the top. Although not illustrated, respective adjacent layers are laminated on the upper side of the first layer 110 and the underside of the third layer 130.

As illustrated in FIG. 2, at the first layer 110, a wiring electrode 112, a wiring electrode 114 (a first wiring electrode), and a wiring electrode 116 are provided. The wiring electrode 114 defines a portion of the inductor L1. The wiring electrode 116 defines a portion of the inductor L3. A terminal C1 of the wiring electrode 112 is connected to a wiring electrode that is provided at a layer on the upper side of the first layer 110 and is connected to the series arm resonator S11. A terminal E1 of the wiring electrode 114 is connected to a wiring electrode that is provided at a layer on the upper side of the first layer 110 and is connected to the resonator S21. A terminal F1 of the wiring electrode 116 is connected to wiring electrodes that are provided at a layer on the upper side of the first layer 110 and are connected to the resonators S22 and S23. The wiring electrodes connected to the resonators S22 and S23 are connected to the ground.

As illustrated in FIG. 3, a wiring electrode 122 (a second wiring electrode) and wiring electrodes 124 and 126 are provided at the second layer 120. The wiring electrode 122 defines a portion of the inductor L2. The wiring electrode 126 defines a portion of the inductor L3. A terminal C2 of the wiring electrode 122 is connected to the terminal C1 of the wiring electrode 112 at the first layer 110. A terminal D2 of the wiring electrode 124 is connected to a terminal D1 of the wiring electrode 114 at the first layer 110. A terminal G2 of the wiring electrode 126 is connected to a terminal G1 of the wiring electrode 116 at the first layer 110.

As illustrated in FIG. 4, a wiring electrode 132, a wiring electrode 134 (the first wiring electrode), and a wiring electrode 136 are provided at the third layer 130. The wiring electrode 134 defines a portion of the inductor L1. The wiring electrode 136 defines a portion of the inductor L3. A terminal A2 of the wiring electrode 132 is connected to a terminal A1 of the wiring electrode 122 at the second layer 120. The terminal A2 of the wiring electrode 132 is also connected to a wiring electrode that is provided at a layer on the underside of the third layer 130 and is connected to the common terminal T0. A terminal B2 of the wiring electrode 134 is connected to a terminal B1 of the wiring electrode 122 at the second layer 120. Accordingly, the inductors L1 and L2 are connected by the terminals B1 and B2.

A terminal D3 of the wiring electrode 134 is connected to the terminal D2 of the wiring electrode 124 at the second layer 120. As described above, the wiring electrode 124 at the second layer 120 is connected to the wiring electrode 114 at the first layer 110. Accordingly, the wiring electrode 134 at the third layer 130 is connected to the wiring electrode 114 at the first layer 110 via the wiring electrode 124 at the second layer 120. The second layer 120 is sandwiched between the first layer 110 and the third layer 130. The wiring electrode 122 at the second layer 120, which defines a portion of the inductor L2, is sandwiched between the wiring electrode 114 at the first layer 110 and the wiring electrode 134 at the third layer 130 which define the inductor L1.

A terminal H2 of the wiring electrode 136 is connected to a terminal H1 of the wiring electrode 126 at the second layer 120. As described above, the wiring electrode 126 is connected to the wiring electrode 116 at the first layer 110. Accordingly, the wiring electrode 116 at the first layer 110, the wiring electrode 126 at the second layer 120, and the wiring electrode 136 at the third layer 130 define a portion of the inductor L3 in an integrated manner. A terminal I1 of the wiring electrode 136 at the third layer 130 is connected to a wiring electrode that is provided at a layer on the underside of the third layer 130 and is connected to the ground.

Figure 5:
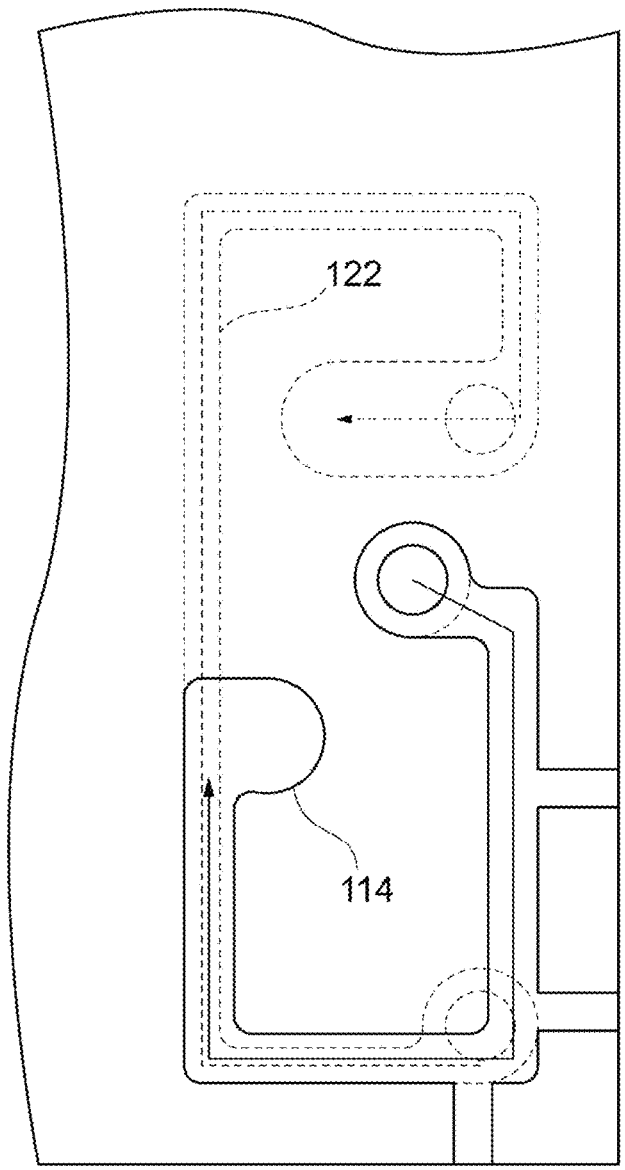
FIG. 5 is a diagram illustrating the positional relationship between a wiring electrode defining an inductor provided at the first layer and a wiring electrode defining an inductor provided at the second layer.
Figure 6:
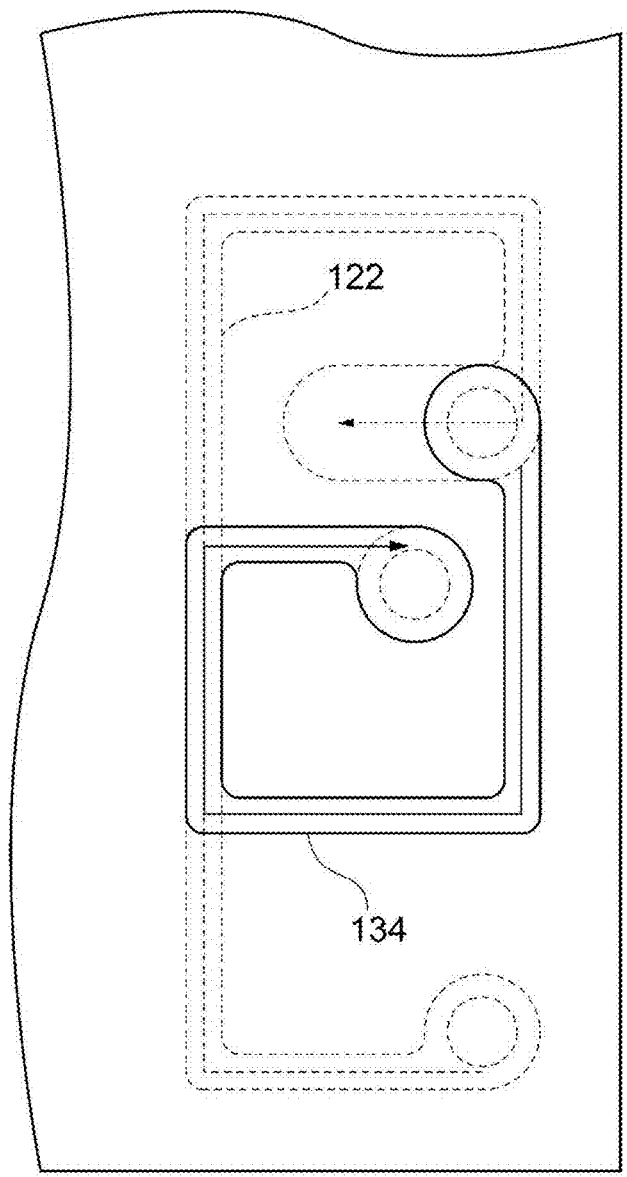
FIG. 6 is a diagram illustrating the positional relationship between the wiring electrode defining the inductor provided at the second layer and a wiring electrode defining an inductor provided at the third layer.

Next, the positional relationship between each of the wiring electrodes 114 and 134 defining a portion of the inductor L1 and the wiring electrode 122 defining a portion of the inductor L2 will be described with reference to FIGS. 5 and 6. FIG. 5 is a diagram illustrating the positional relationship between the wiring electrode 114 defining the inductor L1 at the first layer 110 and the wiring electrode 122 defining the inductor L2 at the second layer 120. FIG. 6 is a diagram illustrating the positional relationship between the wiring electrode 122 defining the inductor L2 at the second layer 120 and the wiring electrode 134 defining the inductor L1 at the third layer 130.

Referring to FIG. 5, the direction of a current at the wiring electrode 114 in the inductor L1 is represented by a solid arrow and the direction of a current at the wiring electrode 122 in the inductor L2 is represented by a broken arrow. At both the wiring electrodes 114 and 122, the direction of a current is a clockwise direction. That is, the winding directions of the wiring electrodes 114 and 122 are the same or substantially the same. The wiring electrode 114 in the inductor L1 and the wiring electrode 122 in the inductor L2 partially overlap. In the overlapping portion, the directions of currents flowing through the wiring electrodes 114 and 122 are the same or substantially the same. Accordingly, magnetic fields generated at the wiring electrodes 114 and 122 are mutually strengthened and the wiring electrodes 114 and 122 are electromagnetically coupled.

In this preferred embodiment, the first layer 110 at which the wiring electrode 114 is provided and the second layer 120 at which the wiring electrode 122 is provided are adjacent to each other. Accordingly, the degree of electromagnetic coupling between the wiring electrodes 114 and 122 is able to be increased.

Referring to FIG. 6, the direction of a current at the wiring electrode 122 in the inductor L2 is represented by a broken arrow and the direction of a current at the wiring electrode 134 in the inductor L1 is represented by a solid arrow. At both the wiring electrodes 122 and 134, the direction of a current is a clockwise direction. That is, the winding directions of the wiring electrodes 122 and 134 are the same or substantially the same. The wiring electrode 122 in the inductor L2 and the wiring electrode 134 in the inductor L1 partially overlap. In the overlapping portion, the directions of currents flowing through the wiring electrodes 122 and 134 are substantially the same. Accordingly, magnetic fields generated at the wiring electrodes 122 and 134 are mutually strengthened and the wiring electrodes 122 and 134 are electromagnetically coupled.

In this preferred embodiment, the second layer 120 at which the wiring electrode 122 is provided and the third layer 130 at which the wiring electrode 134 is provided are adjacent to each other. Accordingly, the degree of electromagnetic coupling between the wiring electrodes 122 and 134 is able to be increased.

Figure 7:
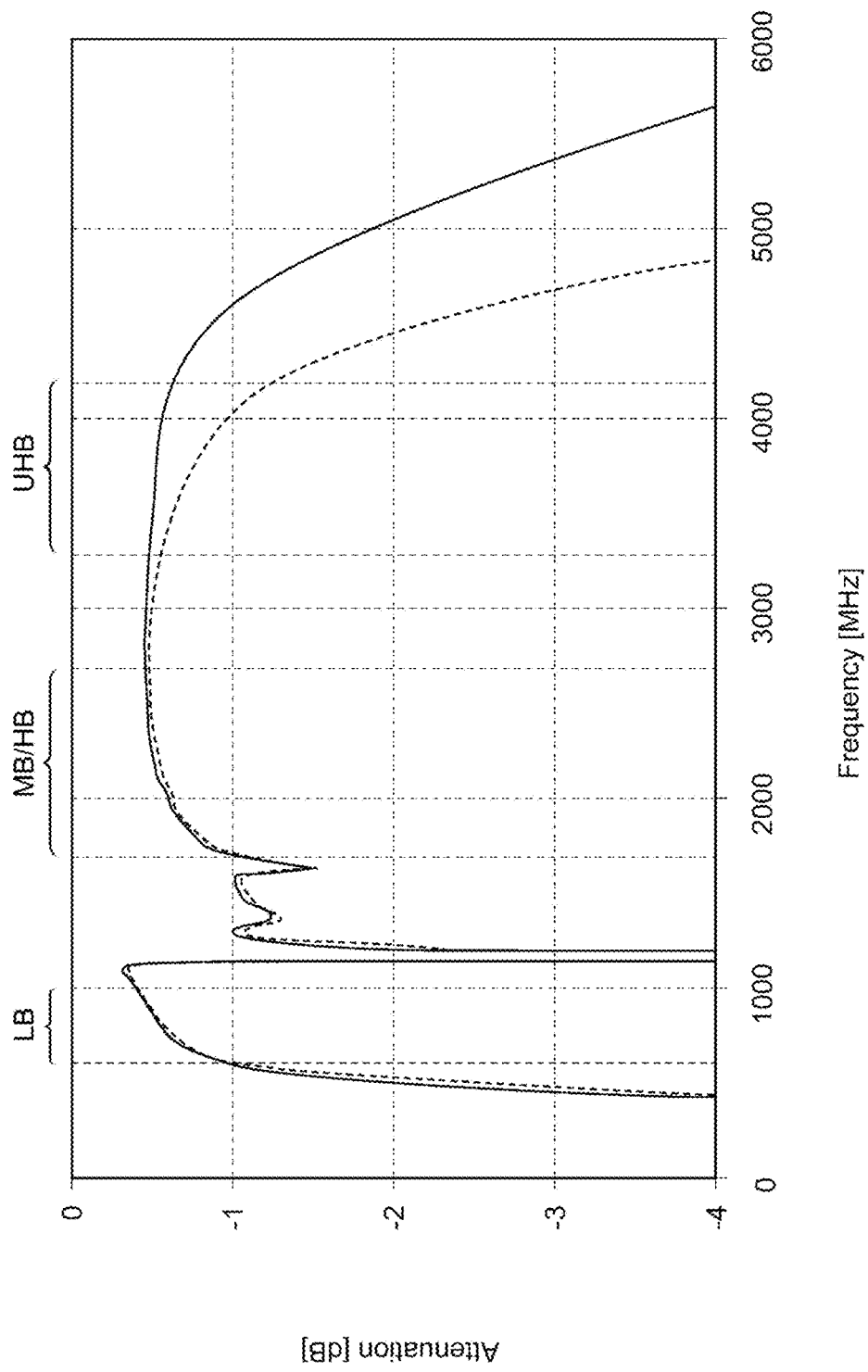
FIG. 7 is a diagram illustrating simulation results of bandpass characteristics of a band elimination filter in Example 1 and Comparative Example 1.
Figure 8:
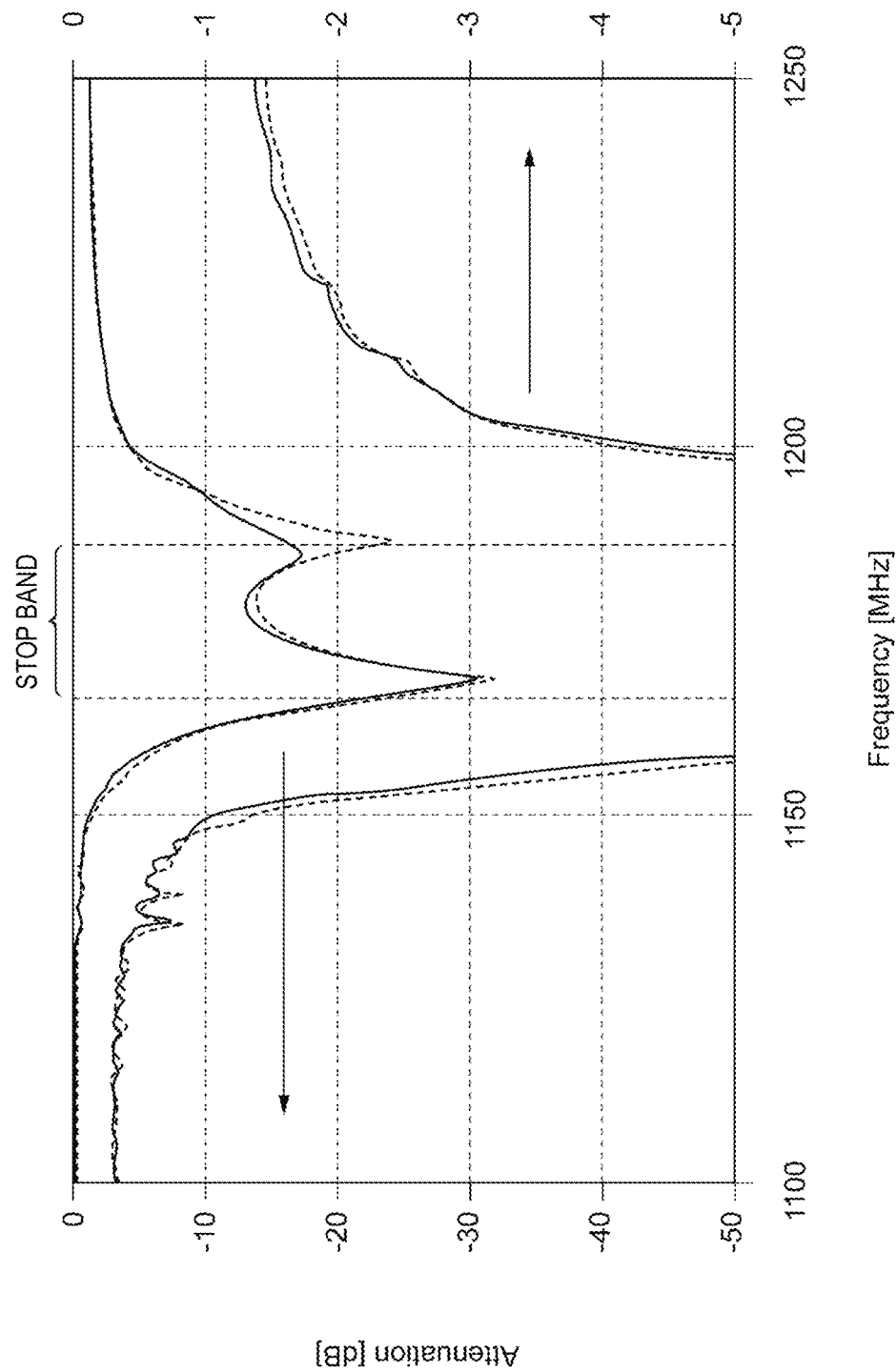
FIG. 8 is a diagram illustrating simulation results of bandpass characteristics of a band elimination filter in Example 1 and Comparative Example 1 in a frequency band near a stop band.

FIGS. 7 and 8 are diagrams illustrating simulation results of bandpass characteristics of a band elimination filter in Example 1 and Comparative Example 1. Example 1 of a composite filter device is the composite filter device 12 described with reference to FIGS. 1 to 6. In contrast, Comparative Example 1 of a composite filter device includes a wiring electrode in an inductor corresponding to the inductor L1 and a wiring electrode in an inductor corresponding to the inductor L2 are spaced apart from each other not to overlap each other. That is, in Comparative Example 1, the two inductors corresponding to the inductors L1 and L2 are not electromagnetically coupled. The bandpass characteristics of a band elimination filter refer to bandpass characteristics provided by including the inductor L1 (an inductor corresponding to the inductor L1 in Comparative Example 1) in addition to the band elimination filter 18.

FIG. 7 is a diagram illustrating the bandpass characteristics of a band elimination filter in the frequency band of about 0 MHz to about 6000 MHz. A solid line represents a simulation result of Example 1 and a broken line represents a simulation result of Comparative Example 1. Similarly, a solid line represents a simulation result of Example 1 and a broken line represents a simulation result of Comparative Example 1 in FIGS. 8 to 10. Referring to FIG. 7, LB (Low Band) corresponds to the frequency band of about 600 MHz to about 1000 MHz, MB (Middle Band) corresponds to the frequency band of about 1700 MHz to about 2000 MHz, HB (High Band) corresponds to the frequency band of about 2000 MHz to about 2700 MHz, and UHB (Ultra High Band) represents the frequency band of about 3300 MHz to about 4200 MHz. FIG. 7 shows that the insertion loss is reduced in the frequency band equal to or higher than about 3000 MHz which includes UHB.

In Example 1, as described above, the inductors L1 and L2 are electromagnetically coupled to each other. Accordingly, in Example 1, a predetermined inductance is able to be provided because the wiring electrode is shorter than the electrode wiring in Comparative Example 1 in which the inductors L1 and L2 are not electromagnetically coupled to each other. By reducing the length of a wiring electrode, stray capacitance is able be significantly reduced and the self-resonant frequency of an inductor is able to be increased. An inductor connected in series with a stray capacitance operates as a low pass filter. Accordingly, when a self-resonant frequency becomes relatively high, a cutoff frequency also becomes relatively high. For this reason, by reducing a stray capacitance, the insertion loss of a band elimination filter in a high frequency band including UHB can be reduced while a predetermined inductance is provided.

FIG. 8 is a diagram illustrating simulation results of bandpass characteristics in a frequency band near a stop band in Example 1 and Comparative Example 1. A signal is attenuated in the stop band in Example 1, similar to Comparative Example 1. Thus, in Example 1, the insertion loss of the band elimination filter in the high frequency band is able to be significantly improved while the band elimination filter performs signal attenuation.

Figure 9:
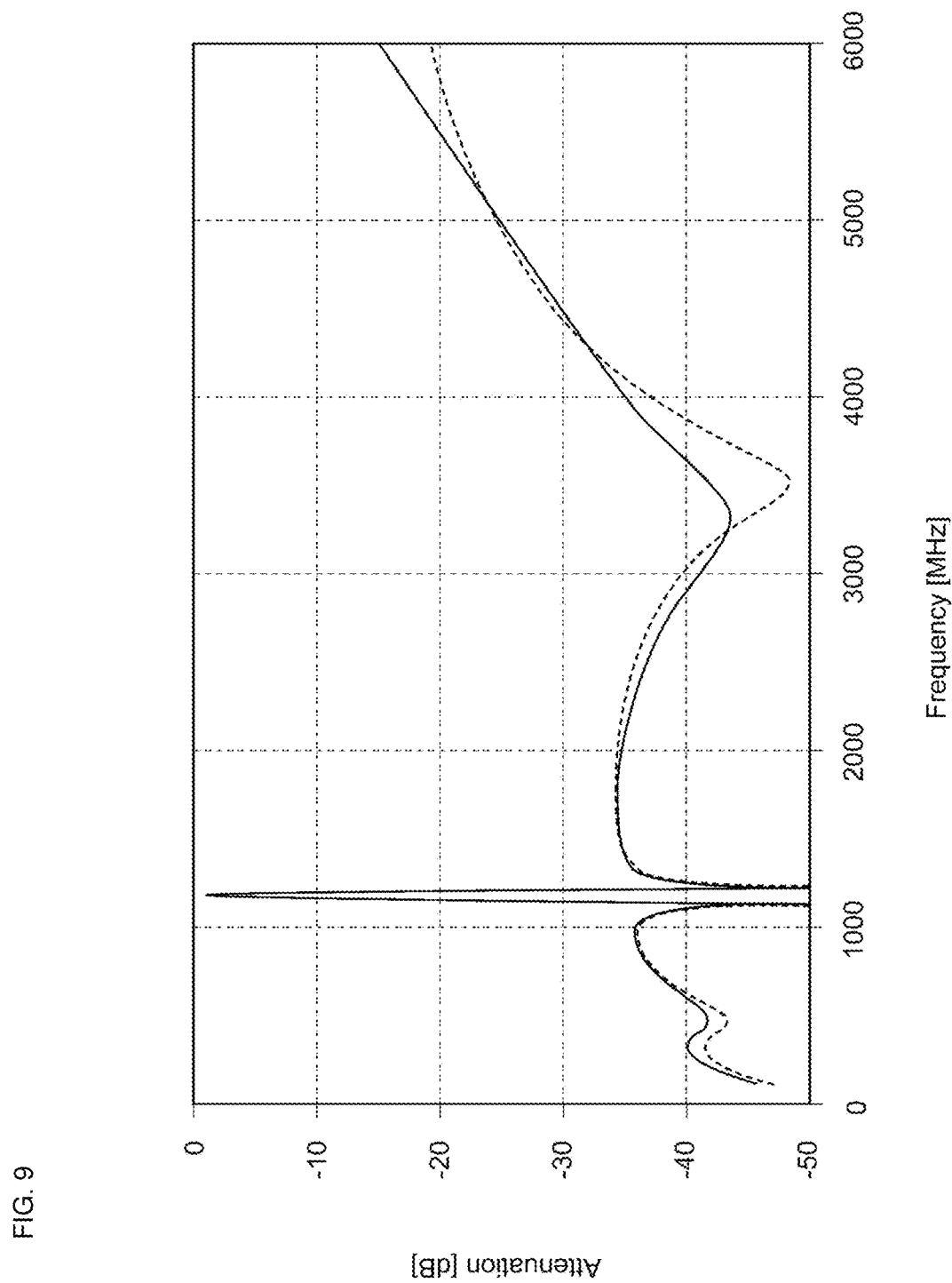
FIG. 9 is a diagram illustrating simulation results of bandpass characteristics of a band pass filter in Example 1 and Comparative Example 1.
Figure 10:
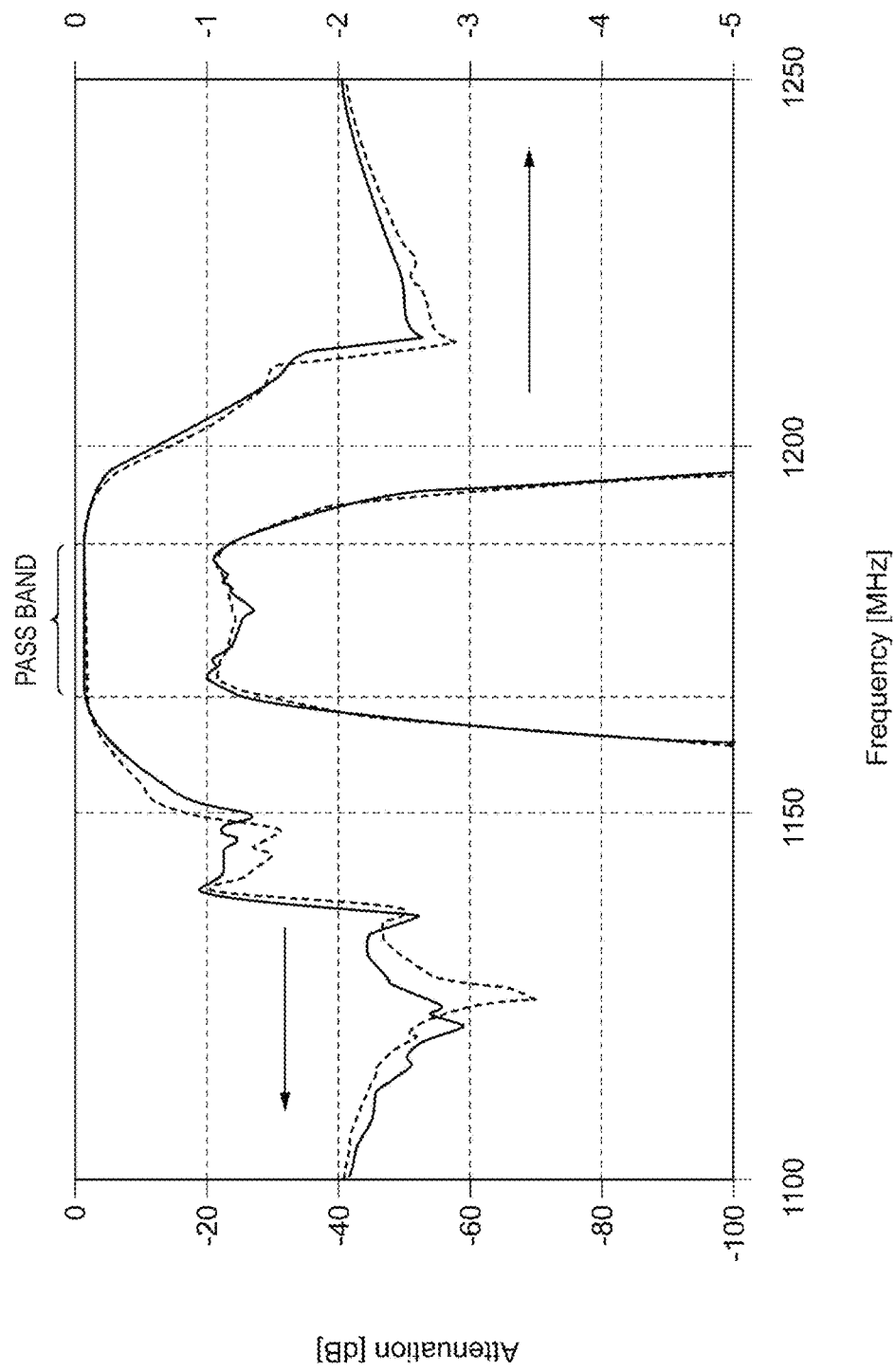
FIG. 10 is a diagram illustrating simulation results of bandpass characteristics of a band pass filter of Example 1 and Comparative Example 1 in a frequency band near a pass band.

FIG. 9 is a diagram illustrating simulation results of bandpass characteristics of a band pass filter in Example 1 and Comparative Example 1. FIG. 10 is a diagram illustrating simulation results of bandpass characteristics of a band pass filter of Example 1 and Comparative Example 1 in a frequency band near the pass band. As illustrated in FIGS. 9 and 10, there is no significant difference between the bandpass characteristics of a band pass filter in Example 1 and Comparative Example 1 and both of the band pass filter are able to pass a signal in the pass band. Thus, in Example 1, the insertion loss of the band elimination filter in the high frequency band can be reduced while the characteristics of the band pass filter are maintained.

Figure 11:
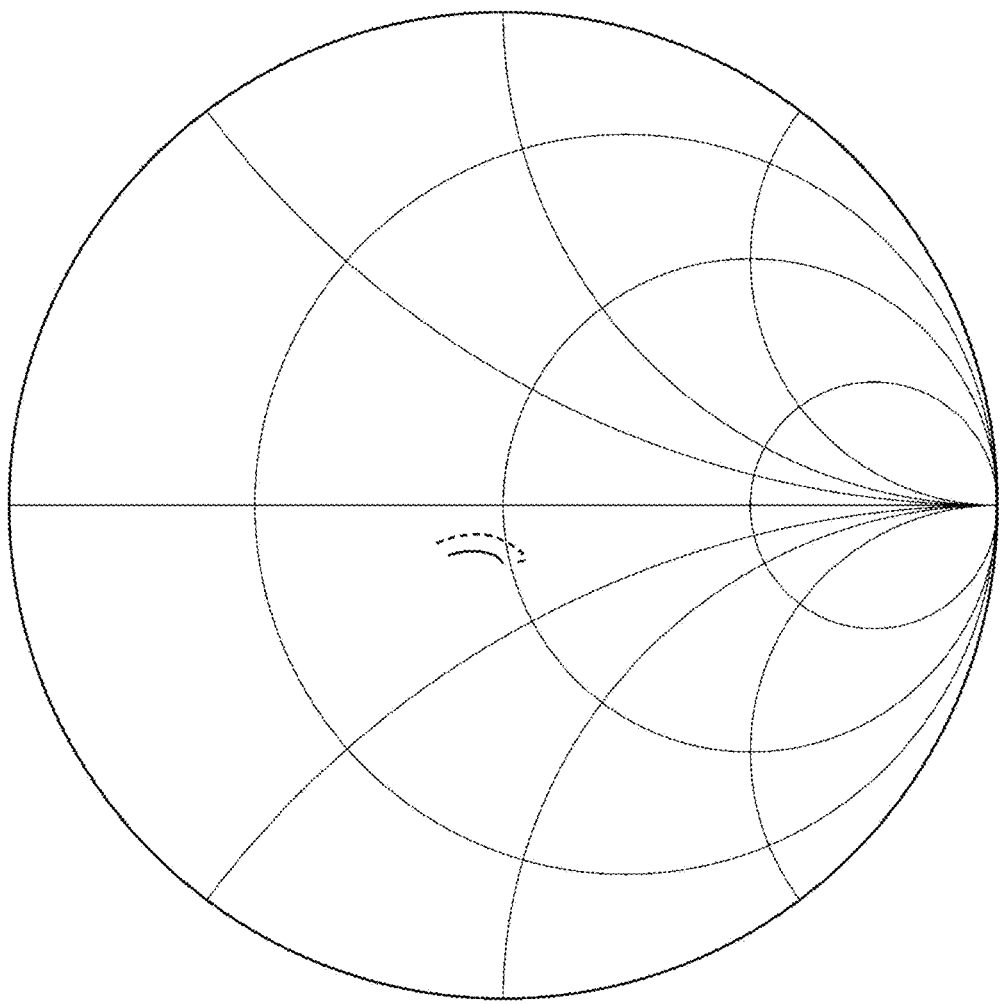
FIG. 11 is a Smith chart illustrating the impedance characteristics of a composite filter device when the composite filter devices are viewed from a common terminal in the frequency band of about 600 MHz to about 1000 MHz in Example 1 and Comparative Example 1.
Figure 12:
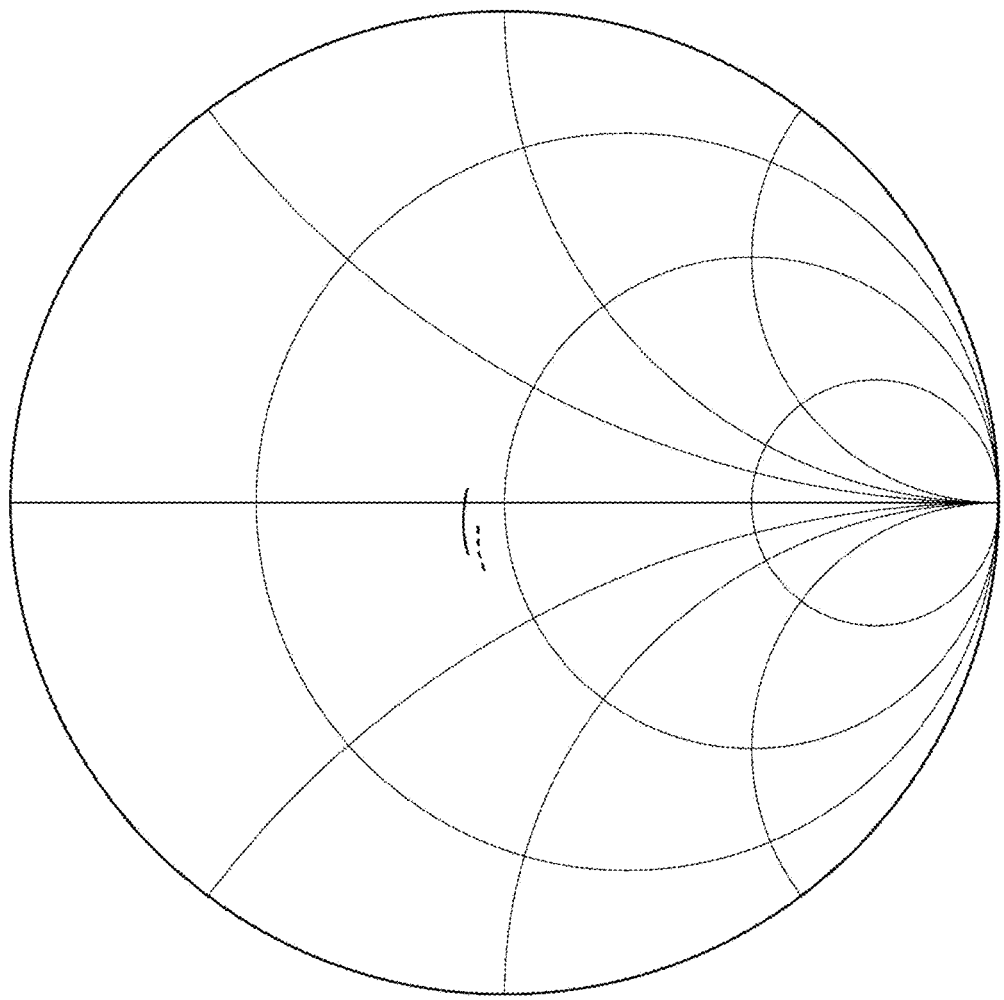
FIG. 12 is a Smith chart illustrating the impedance characteristics of a composite filter device when the composite filter devices are viewed from the common terminal in the frequency band of about 1700 MHz to about 2700 MHz in Example 1 and Comparative Example 1.
Figure 13:
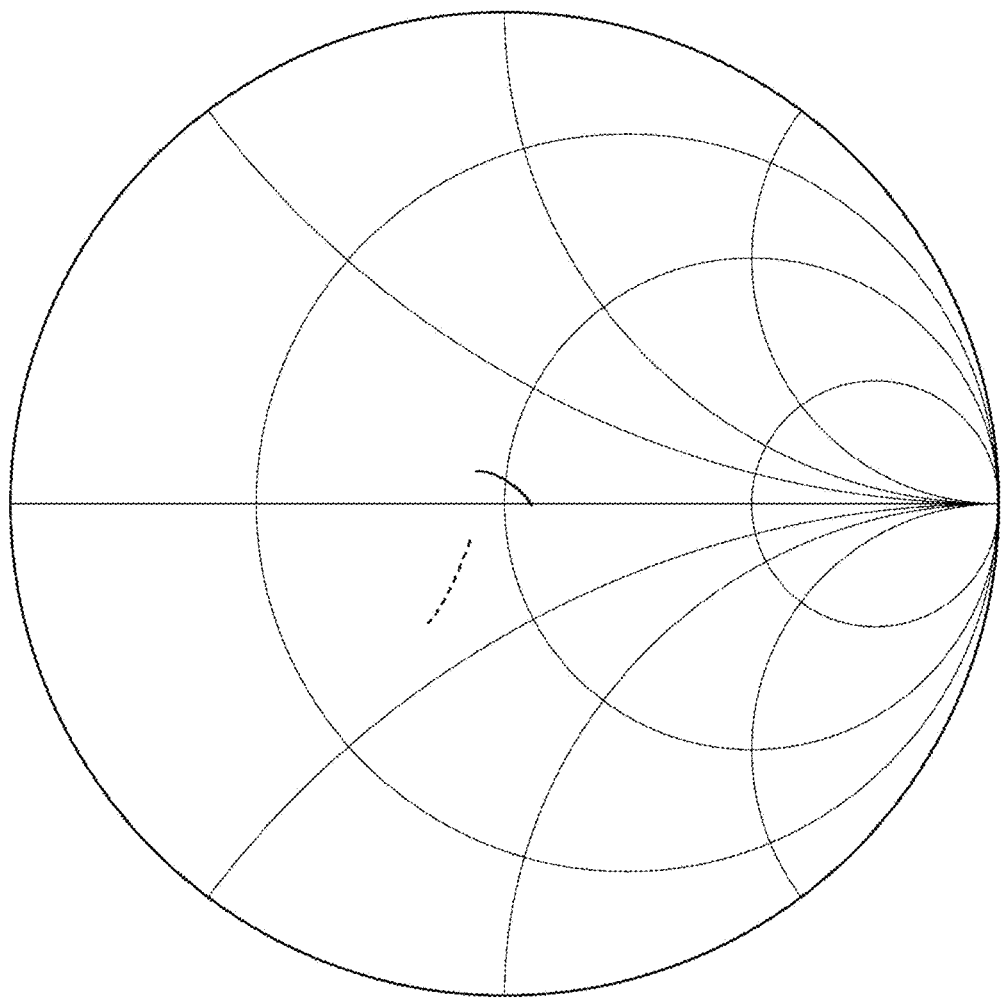
FIG. 13 is a Smith chart illustrating the impedance characteristics of a composite filter device when the composite filter devices are viewed from the common terminal in the frequency band of about 3300 MHz to about 4200 MHz in Example 1 and Comparative Example 1.
Figure 14:
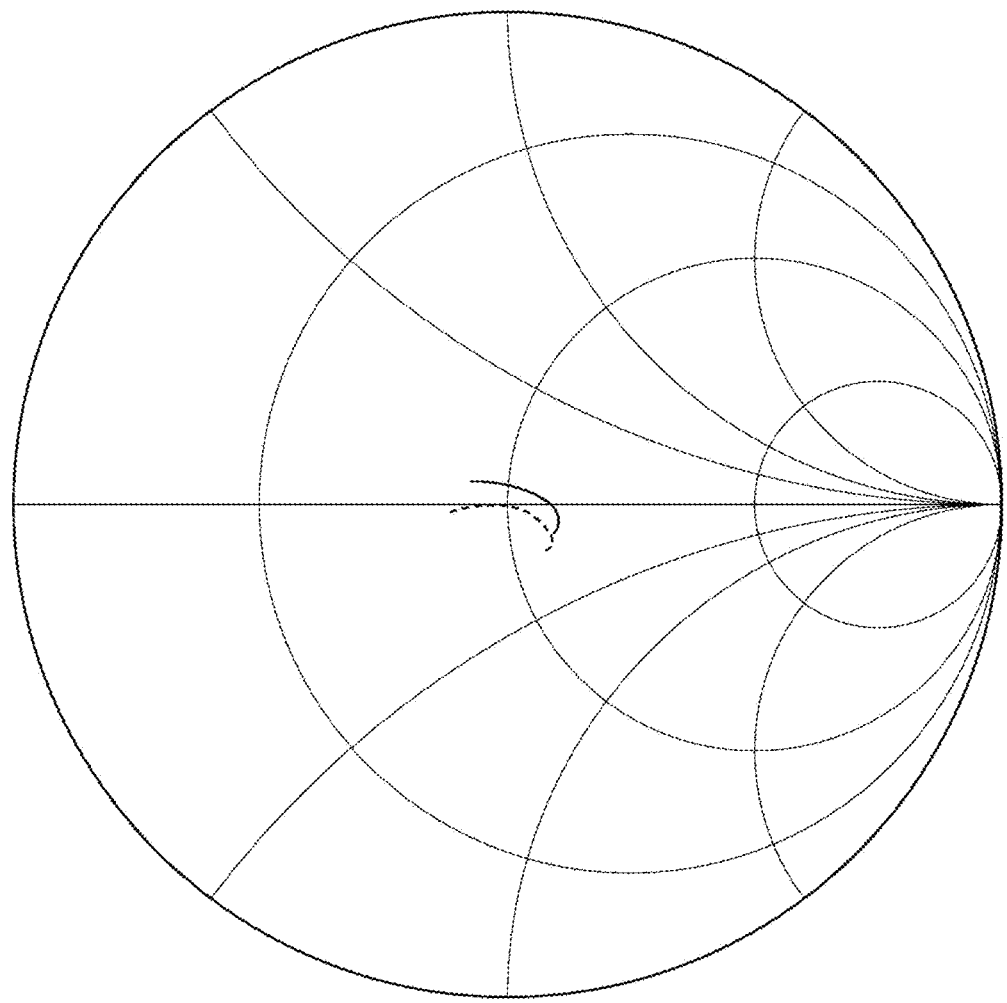
FIG. 14 is a Smith chart illustrating the impedance characteristics of a band elimination filter when the band elimination filters are viewed from a second terminal in the frequency band of about 600 MHz to about 1000 MHz in Example 1 and Comparative Example 1.
Figure 15:
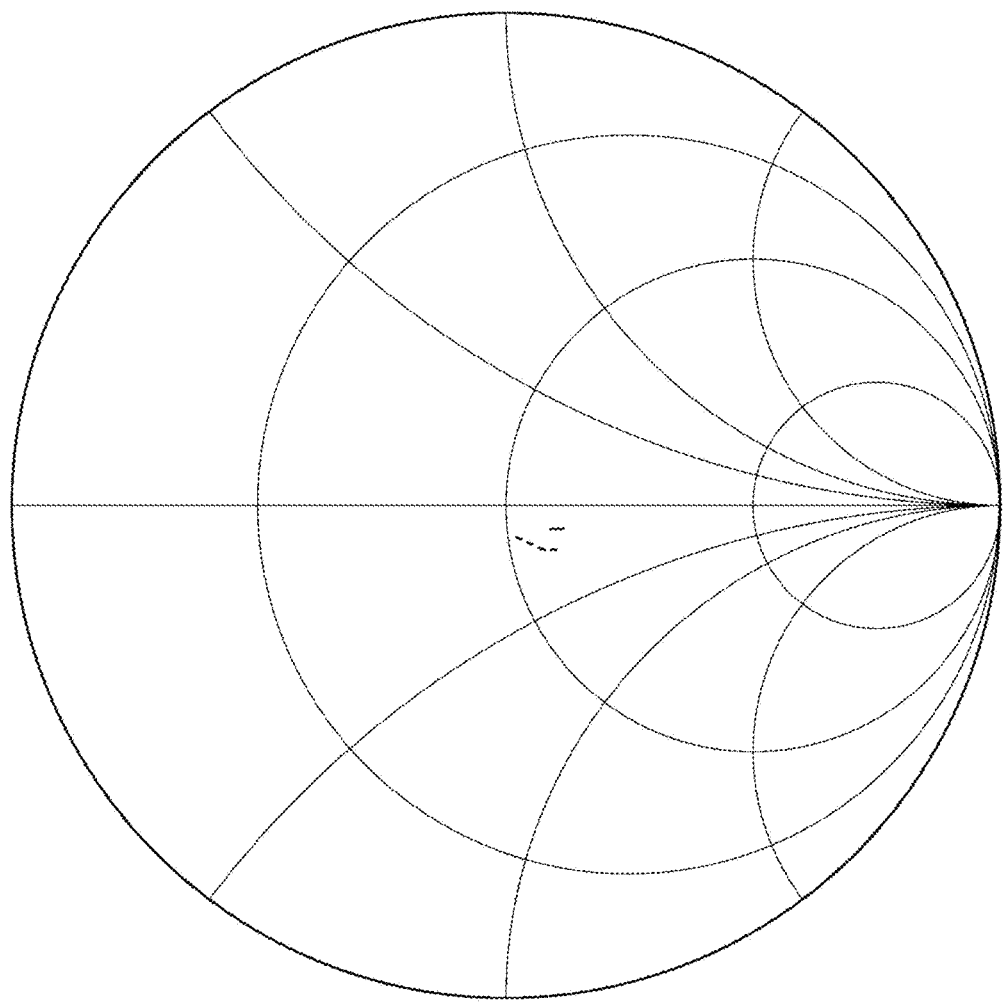
FIG. 15 is a Smith chart illustrating the impedance characteristics of a band elimination filter when the band elimination filters are viewed from the second terminal in the frequency band of about 1700 MHz to about 2700 MHz in Example 1 and Comparative Example 1.
Figure 16:
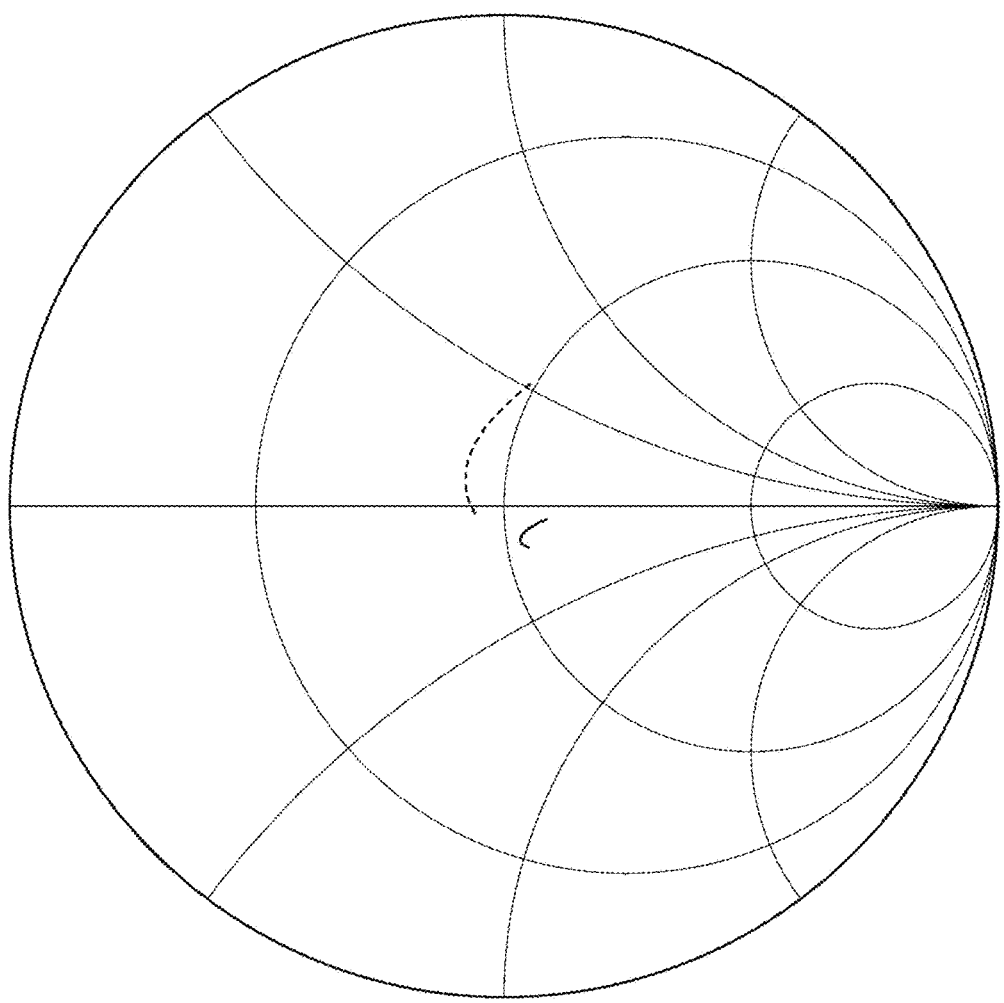
FIG. 16 is a Smith chart illustrating the impedance characteristics of a band elimination filter when the band elimination filters are viewed from the second terminal in the frequency band of about 3300 MHz to about 4200 MHz in Example 1 and Comparative Example 1.

Next, the impedance characteristics of a band elimination filter in Example 1 and Comparative Example 1 will be described with reference to FIGS. 11 to 16. The impedance characteristics of a band elimination filter refer to impedance characteristics provided by including the inductor L1 (an inductor corresponding to the inductor L1 in Comparative Example 1) and the inductor L2 (an inductor corresponding to the inductor L2 in Comparative Example 1) in addition to the band elimination filter 18. FIGS. 11 to 13 are Smith charts illustrating the impedance characteristics of the composite filter device 12 when they are viewed from the common terminal T0 in Example 1 and Comparative Example 1. FIGS. 14 to 16 are Smith charts illustrating the impedance characteristics of a band elimination filter when they are viewed from the second terminal T2 in Example 1 and Comparative Example 1. More specifically, FIGS. 11 and 14 are Smith charts in the frequency band of LB, FIGS. 12 and 15 are Smith charts in the frequency bands of MB and HB, and FIGS. 13 and 16 are Smith charts in the frequency band of UHB. In all of these drawings, a solid line represents the impedance characteristics of Example 1 and a broken line represents the impedance characteristics of Comparative Example 1. FIGS. 11, 12, 14, and 15 show that there is no significant difference between the impedance characteristics of Example 1 and Comparative Example 1 in the frequency bands of LB, MB, and HB.

However, FIGS. 13 and 16 show that an impedance is converged at about 50Ω and is comparatively matched to about 50Ω in Example 1, in contrast to Comparative Example 1. The reason for this is that the inductors L1 and L2 have been electromagnetically coupled, the length of a wiring electrode required to provide a predetermined inductance has been able to be significantly reduced, and the occurrence of a stray capacitance has been able to be reduced or prevented as described above. Thus, according to this preferred embodiment, impedance matching can be performed in the high frequency band including UHB and the insertion loss in the pass band are able to be significantly improved.

In the second preferred embodiment, descriptions of features, components, and elements that common to those in the first preferred embodiment will be omitted and only different points will be described.

Figure 17:
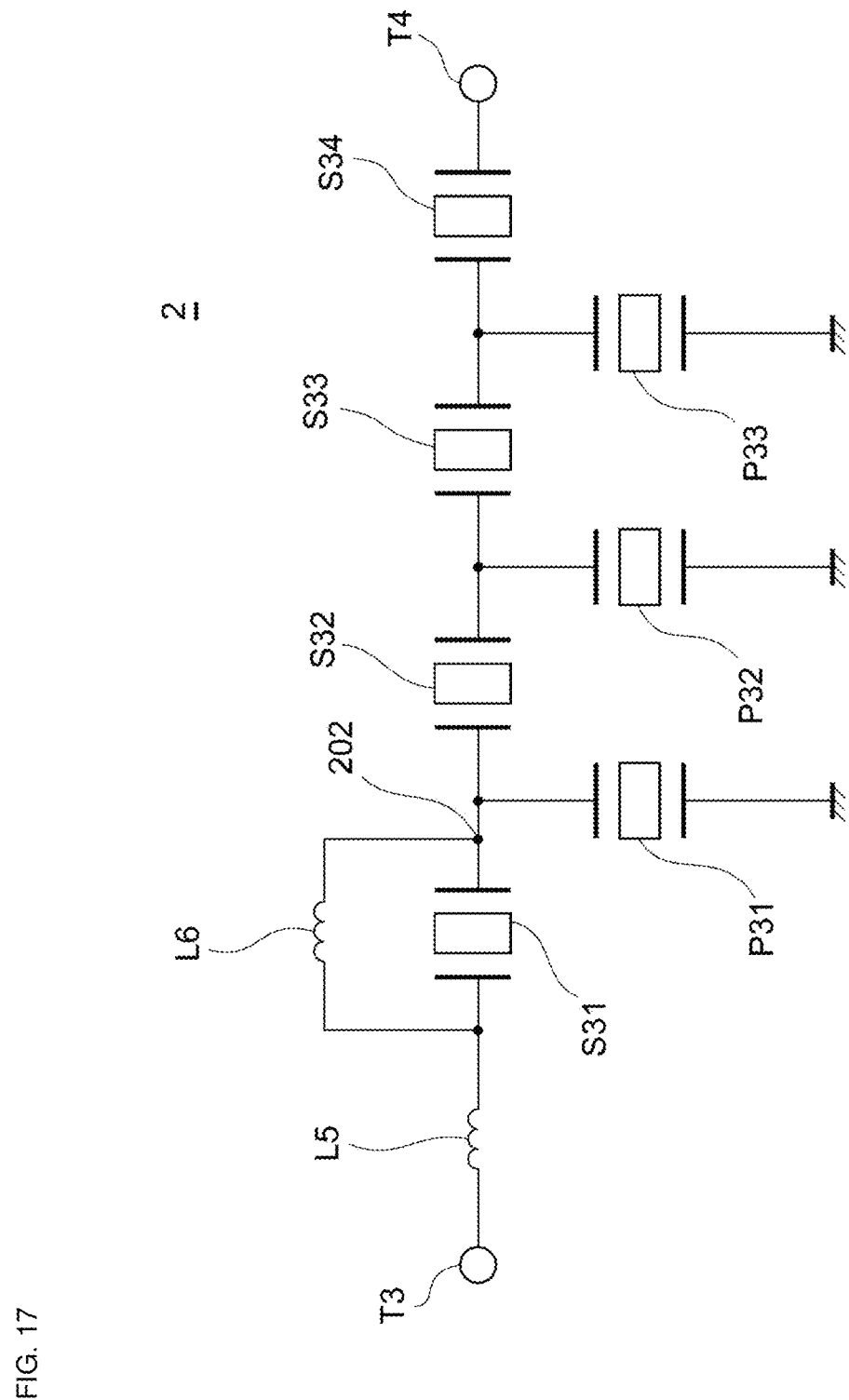
FIG. 17 is a diagram illustrating a band pass filter according to a second preferred embodiment of the present invention.

FIG. 17 is a diagram illustrating a band pass filter 2 according to the second preferred embodiment. The band pass filter 2 according to the second preferred embodiment includes a plurality of series arm resonators provided at a series arm connecting an input terminal T3 and an output terminal T4 and a plurality of parallel arm resonators provided at parallel arms. More specifically, the band pass filter 2 according to the second preferred embodiment includes the four series arm resonators S31 to S34, the three parallel arm resonators P31 to P33, an inductor L5 (a third inductor), and an inductor L6 (fourth inductor). The four series arm resonators S31 to S34 are provided at the series arm connecting the input terminal T3 and the output terminal T4 in order of increasing distance from the input terminal T3. The three parallel arm resonators P31 to P33 are provided at respective parallel arms, and a reference potential (for example, a ground potential) is supplied to the parallel arm resonators P31 to P33. The numbers of the series arm resonators, the parallel arm resonators, and the inductors included in the band pass filter 2 are examples and are not limited to the above-described numbers.

Figure 18:
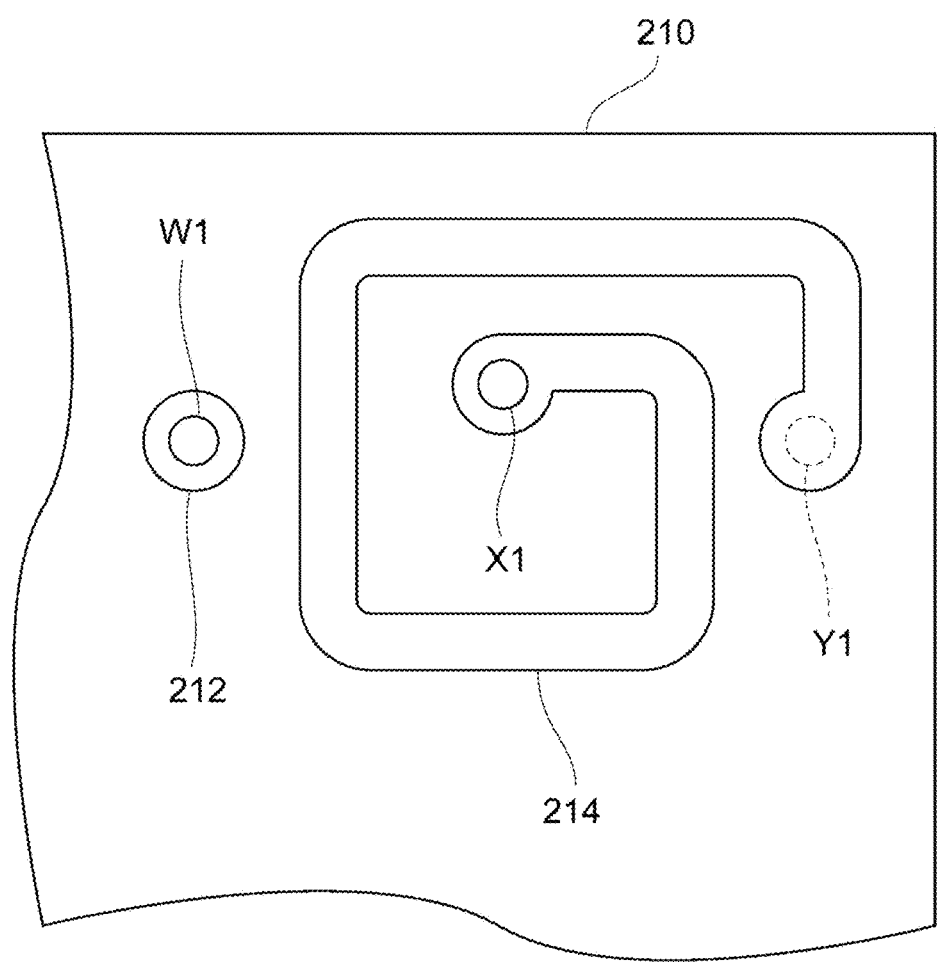
FIG. 18 is a diagram illustrating the layout of a wiring electrode defining a band pass filter according to the second preferred embodiment of the present invention.
Figure 19:
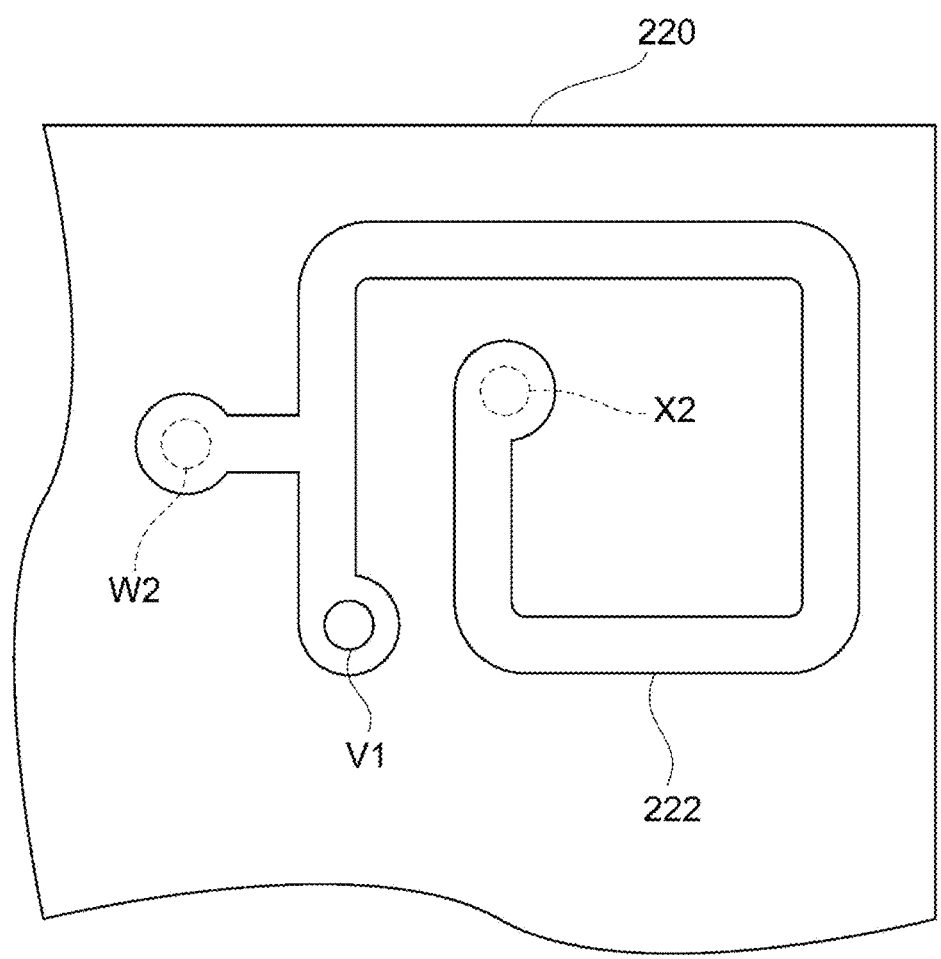
FIG. 19 is a diagram illustrating the layout of a wiring electrode defining a band pass filter according to the second preferred embodiment of the present invention.
Figure 20:
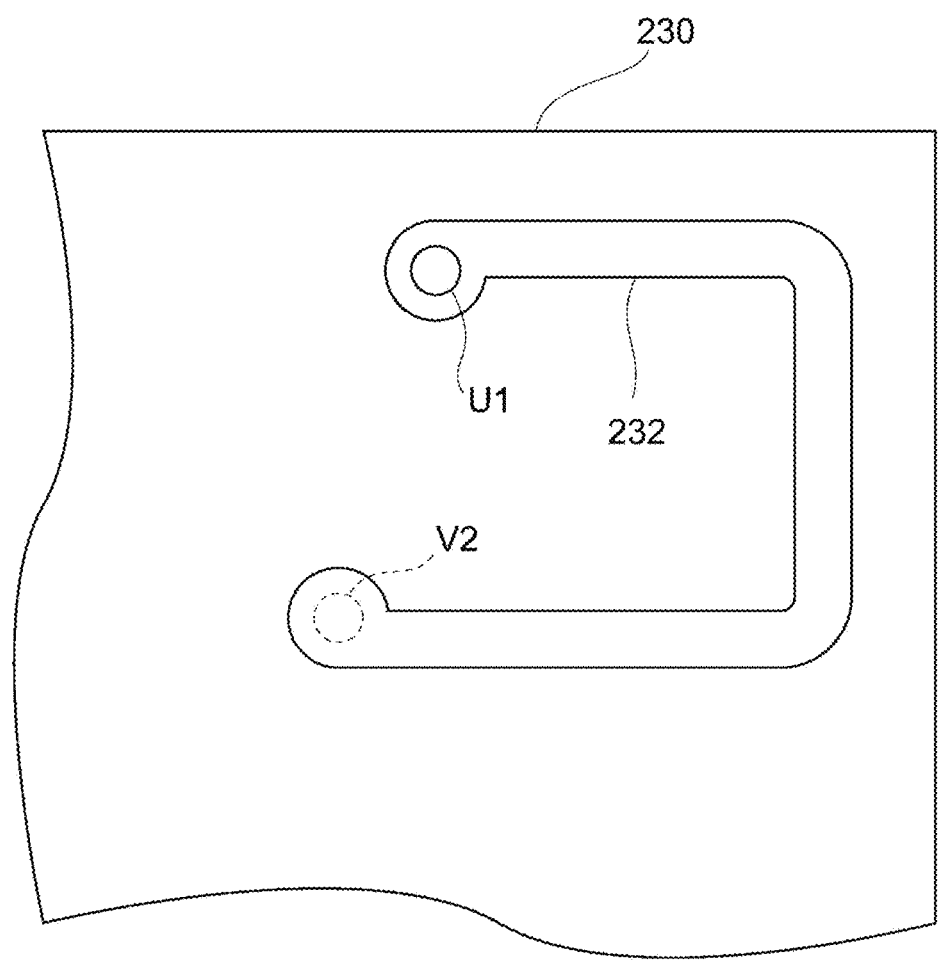
FIG. 20 is a diagram illustrating the layout of a wiring electrode defining a band pass filter according to the second preferred embodiment of the present invention.

In this preferred embodiment, the inductor L5 is connected in series with the input terminal T3. The inductor L6 is connected in parallel with the series arm resonator S31. Various wiring electrodes including wiring electrodes defining portions of the inductors L5 and L6 are provided at the internal layers of a multilayer board having a layered structure. FIGS. 18 to 20 are diagrams illustrating the layout of wiring electrodes in the band pass filter 2 according to the second preferred embodiment. When a direction extending from the back to the front of the drawing sheet is defined as a direction from bottom to top in FIGS. 18 to 20, a first layer 210 illustrated in FIG. 18, a second layer 220 illustrated in FIG. 19, and a third layer 230 illustrated in FIG. 20 are laminated in this order from the top. Respective adjacent layers are laminated on the upper side of the first layer 210 and the underside of the third layer 230.

At the first layer 210 illustrated in FIG. 18, a wiring electrode 212 and a wiring electrode 214 (a fourth wiring electrode) are provided. The wiring electrode 214 defines a portion of the inductor L6. A terminal W1 of the wiring electrode 212 is connected to a wiring electrode that is provided at a layer on the upper side of the first layer 210 and is connected to the input terminal T3. A terminal Y1 of the wiring electrode 214 is connected to a wiring electrode that is provided at a layer on the upper side of the first layer 210 and is connected to a node 202 illustrated in FIG. 17.

At the second layer 220 illustrated in FIG. 19, a wiring electrode 222 (the fourth wiring electrode) is provided. The wiring electrode 222 defines a portion of the inductor L6. A terminal W2 of the wiring electrode 222 is connected to the terminal W1 of the wiring electrode 212 at the first layer 210. A terminal X2 of the wiring electrode 222 is connected to a terminal X1 of the wiring electrode 214 at the first layer 210. Thus, in this preferred embodiment, the wiring electrode 214 at the first layer 210 and the wiring electrode 222 at the second layer 220 define a portion of the inductor L6 in an integrated manner.

At the third layer 230 illustrated in FIG. 20, a wiring electrode 232 (a third wiring electrode) is provided. The wiring electrode 232 defines a portion of the inductor L5. A terminal V2 of the wiring electrode 232 is connected to a terminal V1 of the wiring electrode 222 at the second layer 220. Accordingly, the inductors L5 and L6 are connected by the terminals V1 and V2. A terminal U1 of the wiring electrode 232 at the third layer 230 is connected to a wiring electrode that is provided at a layer on the underside of the third layer 230 and is connected to the input terminal T3.

Figure 21:
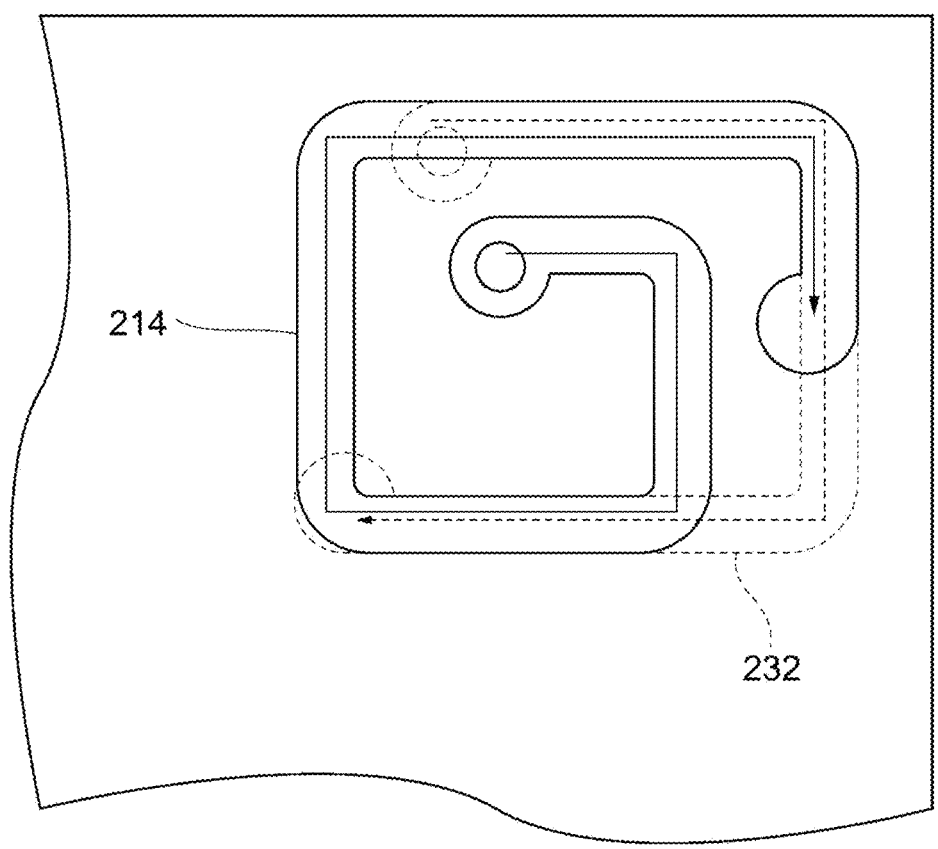
FIG. 21 is a diagram illustrating the positional relationship between a wiring electrode defining an inductor provided at a first layer and a wiring electrode defining an inductor provided at a third layer in the second preferred embodiment of the present invention.

The positional relationship between the wiring electrode defining the inductor L5 and the wiring electrode defining the inductor L6 will be described with reference to FIGS. 21 and 22. FIG. 21 is a diagram illustrating the positional relationship between the wiring electrode 214 defining the inductor L6 at the first layer 210 and the wiring electrode 232 defining the inductor L5 at the third layer 230 when a multilayer board is viewed in plan. Referring to FIG. 21, a solid arrow represents the direction of a current flowing through the wiring electrode 214 and a broken arrow represents the direction of a current flowing through the wiring electrode 232. At both the wiring electrodes 214 and 232, the direction of a current is a clockwise direction. Accordingly, the winding directions of the wiring electrodes 214 and 232 are the same or substantially the same.

The wiring electrodes 214 and 232 partially overlap. In the overlapping portion, the directions of currents flowing through the wiring electrodes 214 and 232 are substantially the same. Accordingly, the degree of electromagnetic coupling between the wiring electrodes 214 and 232 is relatively high.

Figure 22:
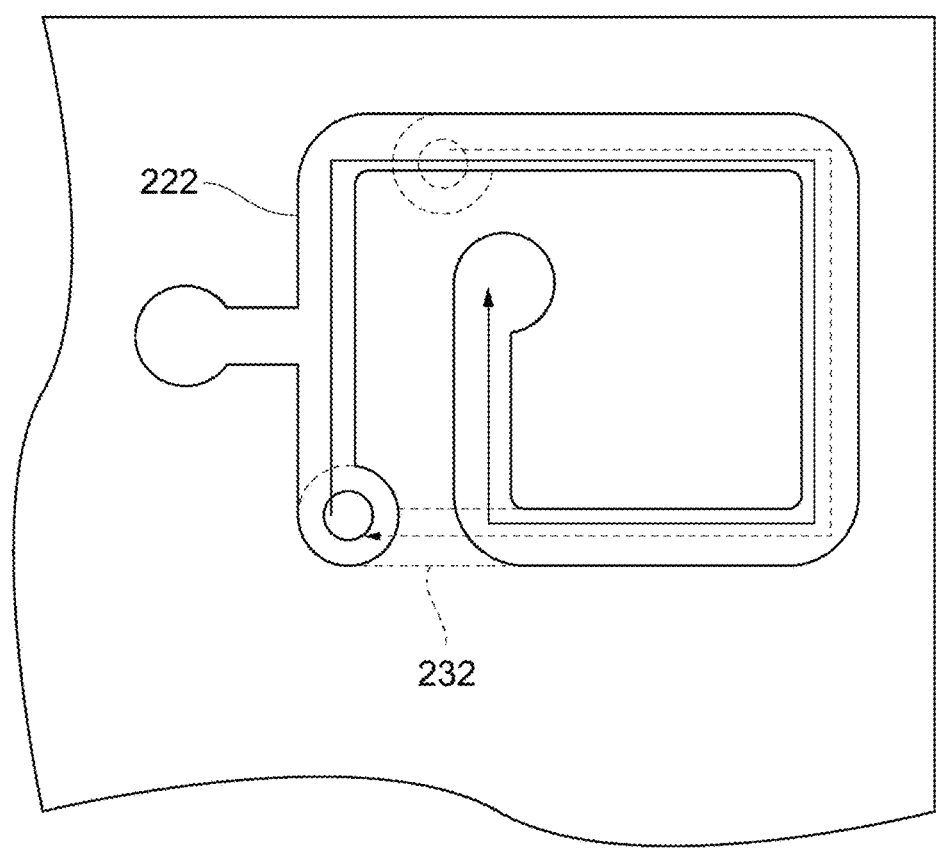
FIG. 22 is a diagram illustrating the positional relationship between a wiring electrode defining an inductor provided at a second layer and the wiring electrode defining the inductor provided at the third layer in the second preferred embodiment of the present invention.

FIG. 22 is a diagram illustrating the positional relationship between the wiring electrode 222 defining the inductor L6 at the second layer 220 and the wiring electrode 232 defining the inductor L5 at the third layer 230 when a multilayer board is viewed in plan. Referring to FIG. 22, a solid arrow represents the direction of a current flowing through the wiring electrode 222 and a broken arrow represents the direction of a current flowing through the wiring electrode 232. At both the wiring electrodes 222 and 232, the direction of a current is a clockwise direction. Accordingly, the winding directions of the wiring electrodes 222 and 232 are the same or substantially the same.

The wiring electrodes 222 and 232 partially overlap. In the overlapping portion, the directions of currents flowing through the wiring electrodes 222 and 232 are substantially the same. Accordingly, the degree of electromagnetic coupling between the wiring electrodes 222 and 232 is relatively high.

Figure 23:
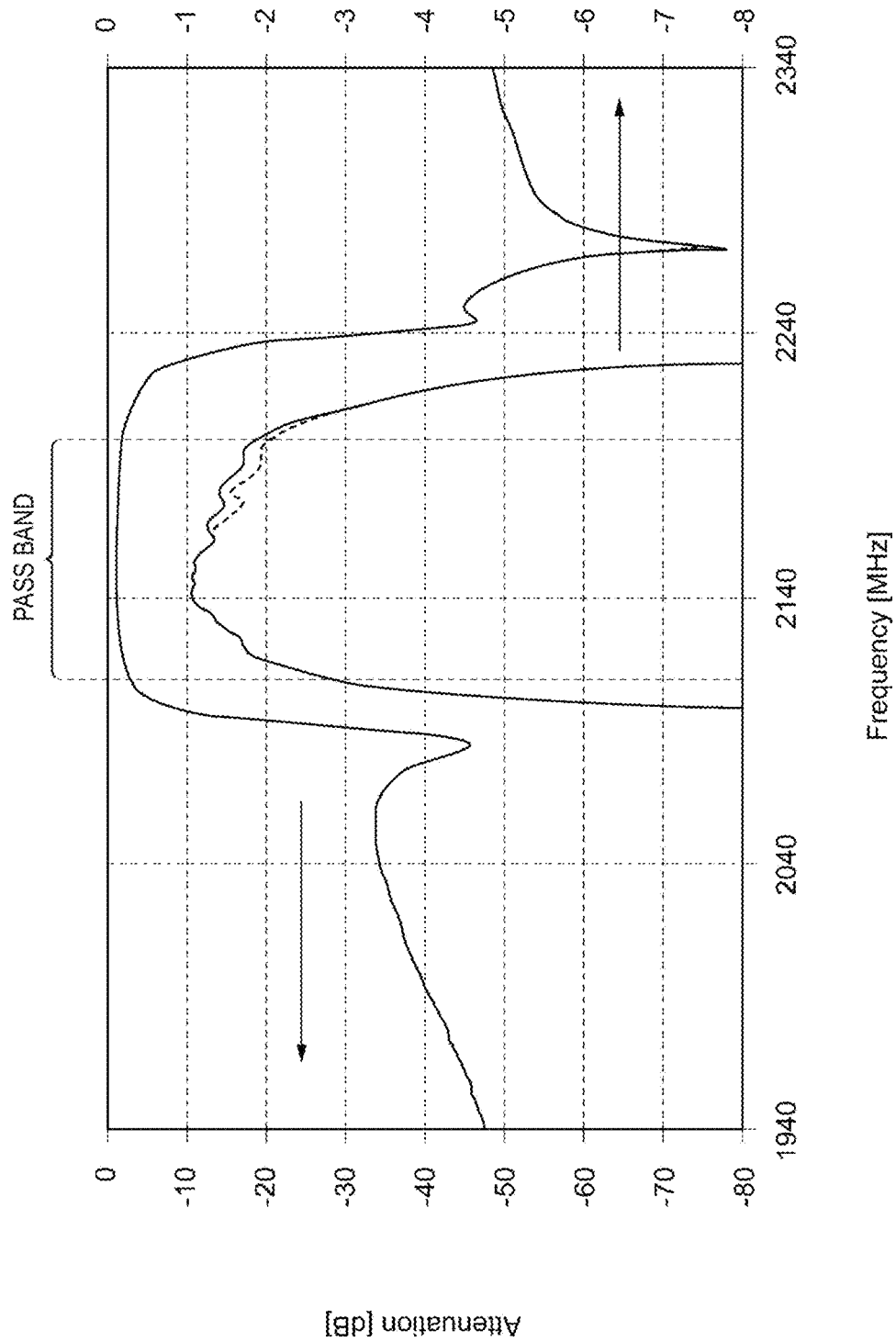
FIG. 23 is a diagram illustrating simulation results of bandpass characteristics of a band pass filter in Example 2 and Comparative Example 2 in a frequency band near a pass band.
Figure 24:
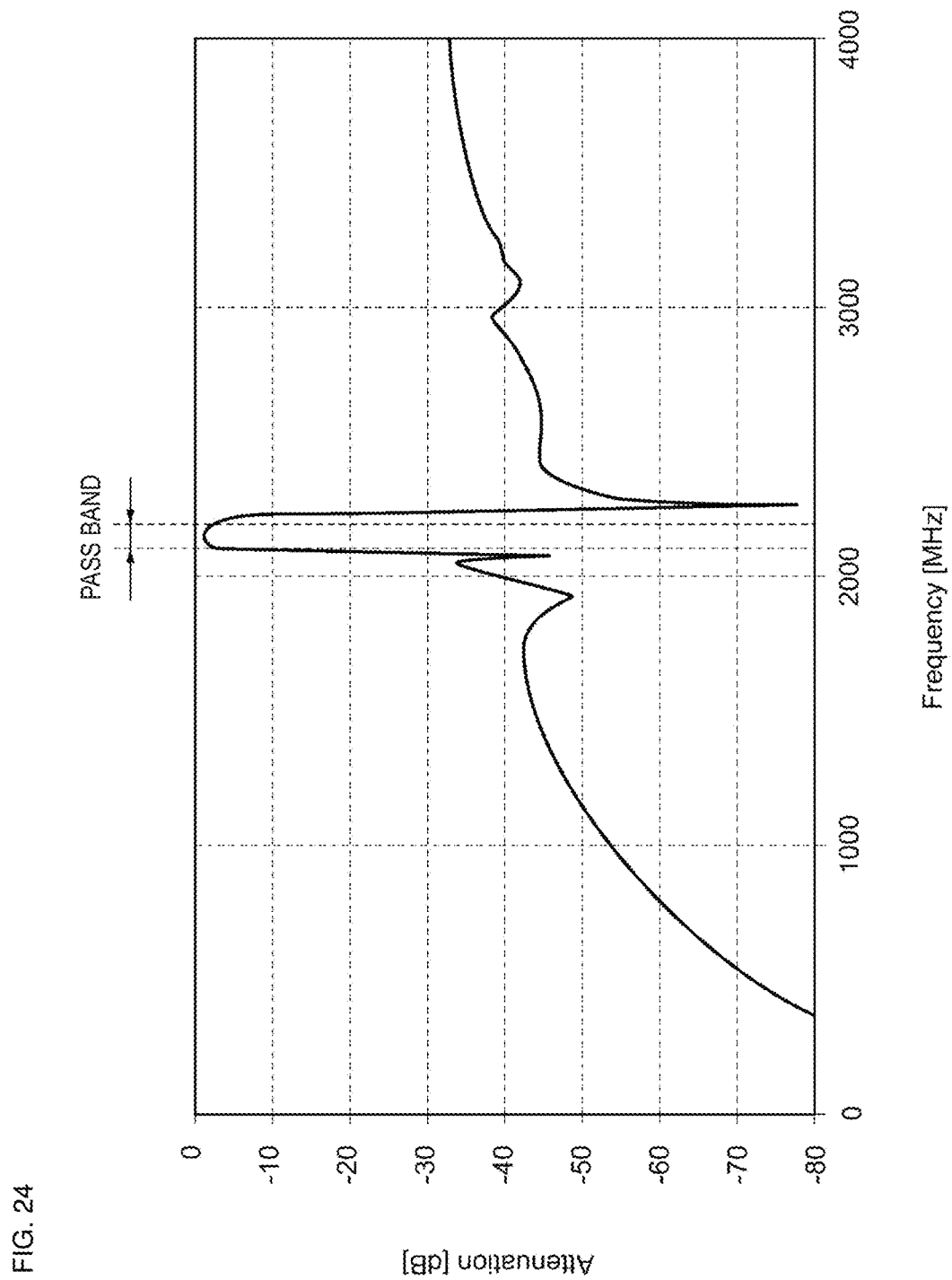
FIG. 24 is a diagram illustrating simulation results of bandpass characteristics of a band pass filter in Example 2 and Comparative Example 2.

FIGS. 23 and 24 are diagrams illustrating simulation results of bandpass characteristics of a band pass filter of Example 2 and Comparative Example 2. Example 2 of a band pass filter is the band pass filter 2 described with reference to FIGS. 17 to 22. In contrast, Comparative Example 2 shows a band pass filter in which the wiring electrode defining the inductor L5 and the wiring electrode defining the inductor L6 do not overlap. Accordingly, in Comparative Example 2, two inductors corresponding to the inductors L5 and L6 are not electromagnetically coupled.

As illustrated in FIG. 23, the insertion loss on the higher-frequency side is significantly reduced in Example 2 as compared with Comparative Example 2. In Example 2, the degree of the electromagnetic coupling between the inductors L5 and L6 is relatively high. Accordingly, the length of a wiring electrode required to provide a predetermined inductance is able to be significantly reduced and the occurrence of a stray capacitance is able to be reduced or prevented. Accordingly, the self-resonant frequencies of the inductors are increased and bandpass characteristics in the pass band are improved.

As illustrated in FIG. 24, there is no significant difference in bandpass characteristics in a frequency band outside the pass band between Example 2 and Comparative Example 2 of a band pass filter and they both pass a signal in the pass band. The pole at about 1900 MHz is an attenuation pole.

The preferred embodiments described above are intended to help easily understand the present invention and are not to be used to limit the present invention. Elements included in the preferred embodiments and the arrangements, materials, conditions, shapes, sizes, and the like are not limited to those illustrated as examples but may be modified as appropriate. Furthermore, the features, components, and elements described in the different preferred embodiments can be partially replaced or combined.

For example, in the preferred embodiments described above, two wiring electrodes overlapping when viewed in plan are provided at adjacent layers, but do not necessarily have to be provided at adjacent layers.

In the first preferred embodiment, the wiring electrode 122 defining a portion of the inductor L2 is sandwiched between the wiring electrodes 114 and 134 defining the inductor L1. The wiring electrode defining at least a portion of the inductor L1 may be sandwiched between the wiring electrodes defining at least a portion of the inductor L2. In a band pass filter according to the second preferred embodiment, the wiring electrode defining at least a portion of the inductor L5 may be sandwiched between the wiring electrodes defining at least a portion of the inductor L6. Alternatively, the wiring electrode defining at least a portion of the inductor L6 may be sandwiched between the wiring electrodes defining at least a portion of the inductor L5.

In the first preferred embodiment, the inductor L1 is connected in series between the band elimination filter 18 and the node 102. However, an inductor (i.e., an inductor corresponding to the inductor L1) including a wiring electrode at least partially overlapping the wiring electrode in the inductor L2 when a multilayer board is viewed in plan may be connected in series between a filter other than the band elimination filter 18 (for example, the band pass filter 14) and the node 102. Accordingly, the inductor L1 does not necessarily have to be connected in series between the band elimination filter 18 and the node 102.

In the second preferred embodiment, the inductor L6 is connected in parallel with the series arm resonator S31 nearest to the input terminal T3. However, an inductor (i.e., an inductor corresponding to the inductor L6) including a wiring electrode at least partially overlapping the wiring electrode in the inductor L5 when a multilayer board is viewed in plan may be connected in parallel with any one of the series arm resonators included in the band pass filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device comprising:
   a connection portion connected to a common terminal;
   a first filter between the connection portion and a first terminal;
   a second filter between the connection portion and a second terminal;
   a first inductor that is connected in series between the second filter and the connection portion, includes a first wiring electrode wound in a predetermined direction, and is provided at at least a first internal layer of a multilayer board; and
   a second inductor that is connected in series between the common terminal and the connection portion, includes a second wiring electrode wound in the predetermined direction, and is provided at at least a second internal layer of the multilayer board; wherein
   the first wiring electrode and the second wiring electrode at least partially overlap when the multilayer board is viewed in a plan view;
   the multilayer board includes a plurality of layers where the first wiring electrode and the second wiring electrode are provided; and
   at least a portion of the first wiring electrode is provided at at least two of the layers sandwiching one of the layers where the second wiring electrode is provided or at least a portion of the second wiring electrode is provided at at least two of the layers sandwiching one of the layers where the first wiring electrode is provided.

2. The composite filter device according to claim 1, wherein
   one of the first filter and the second filter is a band pass filter that passes signals in a predetermined frequency band; and
   another one of the first filter and the second filter is a band elimination filter that attenuates signals in the predetermined frequency band.

3. A communication device, comprising:
   an antenna; and
   the composite filter device according to claim 1; wherein
   the antenna is connected to the common terminal.

4. A composite filter device comprising:
   a connection portion connected to a common terminal;
   a first filter between the connection portion and a first terminal;
   a second filter between the connection portion and a second terminal;
   a first inductor that is connected in series between the second filter and the connection portion, includes a first wiring electrode wound in a predetermined direction, and is provided at at least a first internal layer of a multilayer board; and
   a second inductor that is connected in series between the common terminal and the connection portion, includes a second wiring electrode wound in the predetermined direction, and is provided at at least a second internal layer of the multilayer board; wherein
   the first wiring electrode and the second wiring electrode at least partially overlap when the multilayer board is viewed in a plan view;
   one of the first filter and the second filter is a band pass filter that passes signals in a predetermined frequency band;
   another one of the first filter and the second filter is a band elimination filter that attenuates signals in the predetermined frequency band; and
   the band elimination filter is a notch filter.

5. The composite filter device according to claim 4, wherein
the multilayer board includes a plurality of layers where the first wiring electrode and the second wiring electrode are provided; and
at least a portion of the first wiring electrode and at least a portion of the second wiring electrode are provided at adjacent ones of the plurality of layers.

6. The composite filter device according to claim 5, wherein
at least a portion of the first wiring electrode is provided at at least two of the layers sandwiching one of the layers where the second wiring electrode is provided or at least a portion of the second wiring electrode is provided at at least two of the layers sandwiching one of the layers where the first wiring electrode is provided.

7. A band pass filter comprising:
a plurality of series arm resonators provided at a series arm connecting an input terminal and an output terminal;
a plurality of parallel arm resonators provided at parallel arms;
a first inductor that includes a first end connected to the input terminal or the output terminal and a second end connected in series with the plurality of series arm resonators, includes a first wiring electrode wound in a predetermined direction, and is provided at an internal layer of a multilayer board; and
a second inductor that includes a first end connected in parallel with one of the series arm resonators, includes a second wiring electrode wound in the predetermined direction, and is provided at an internal layer of the multilayer board; wherein
the first wiring electrode and the second wiring electrode at least partially overlap when the multilayer board is viewed in a plan view.

8. The band pass filter according to claim 7, wherein each of the plurality of series arm resonators and each of the plurality of parallel arm resonators is a surface acoustic wave filter, a piezoelectric thin film resonator, or a bulk acoustic wave filter.

9. The band pass filter according to claim 7, wherein the second inductor includes a second end that is connected to a reference potential.

10. The band pass filter according to claim 7, wherein
the plurality of series arm resonators are connected in series with each other; and
a first end of at least one of the plurality of parallel arm resonators is connected to a node between two adjacent ones of the plurality of series arm resonators.

11. The band pass filter according to claim 10, wherein a second end of the at least one of the plurality of parallel arm resonators is connected to a reference potential.

12. The band pass filter according to claim 7, wherein
the multilayer board includes a plurality of layers; and
at least a portion of the first wiring electrode and at least a portion of the second wiring electrode are provided at adjacent ones of the layers.

13. The band pass filter according to claim 12, wherein
at least a portion of the first wiring electrode is provided at at least two of the layers sandwiching one of the layers where the second wiring electrode is provided or at least a portion of the second wiring electrode is provided at at least two of the layers sandwiching one of the layers where the first wiring electrode is provided.

14. The band pass filter according to claim 7, wherein
the multilayer board includes a plurality of layers where the first wiring electrode and the second wiring electrode are provided; and
at least a portion of the first wiring electrode is provided at at least two of the layers sandwiching one of the layers where the second wiring electrode is provided or at least a portion of the second wiring electrode is provided at at least two of the layers sandwiching one of the layers where the first wiring electrode is provided.

* * * * *